United States Patent
Yamamoto et al.

(10) Patent No.: US 11,962,282 B2
(45) Date of Patent: Apr. 16, 2024

(54) ACOUSTIC WAVE DEVICE, FILTER, AND MULTIPLEXER

(71) Applicant: TAIYO YUDEN CO., LTD., Tokyo (JP)

(72) Inventors: Shinji Yamamoto, Tokyo (JP); Toshio Nishizawa, Tokyo (JP); Naoki Kakita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 458 days.

(21) Appl. No.: 17/323,598

(22) Filed: May 18, 2021

(65) Prior Publication Data

US 2021/0399709 A1 Dec. 23, 2021

(30) Foreign Application Priority Data

Jun. 17, 2020 (JP) .................... 2020-104639

(51) Int. Cl.
*H03H 9/02* (2006.01)
*H03H 9/05* (2006.01)
(Continued)

(52) U.S. Cl.
CPC ...... *H03H 9/02102* (2013.01); *H03H 9/0504* (2013.01); *H03H 9/132* (2013.01); *H03H 9/17* (2013.01); *H03H 9/54* (2013.01)

(58) Field of Classification Search
CPC .. H03H 9/02102; H03H 9/0504; H03H 9/132; H03H 9/17; H03H 9/54;
(Continued)

(56) References Cited

U.S. PATENT DOCUMENTS

2005/0275309 A1 12/2005 Oshio .................... 310/313
2014/0232239 A1* 8/2014 Iwasaki ............. H03H 9/02937
310/313 C
(Continued)

FOREIGN PATENT DOCUMENTS

JP S 52-153647 A 12/1977
JP 2001-053579 A 2/2001
(Continued)

OTHER PUBLICATIONS

Notice of Reasons for Refusal dated Jan. 30, 2024, issued by the Japanese Patent Office in corresponding application JP 2020-104639.

*Primary Examiner* — Rakesh B Patel
*Assistant Examiner* — Jorge L Salazar, Jr.
(74) *Attorney, Agent, or Firm* — Stein IP, LLC

(57) ABSTRACT

An acoustic wave device including a support substrate, a piezoelectric layer provided over the support substrate, at least one pair of comb-shaped electrodes disposed on the piezoelectric layer, each of the at least one pair of comb-shaped electrodes including electrode fingers, a temperature compensation film interposed between the support substrate and the piezoelectric layer, the temperature compensation film having a temperature coefficient of elastic constant opposite in sign to a temperature coefficient of elastic constant of the piezoelectric layer; and an insulating layer interposed between the support substrate and the temperature compensation film, a first surface of the insulating layer having first protruding portions and/or first recessed portions, a second surface of the insulating layer having second protruding portions and/or second recessed portions, the first surface being closer to the support substrate, the second surface being closer to the temperature compensation film.

20 Claims, 14 Drawing Sheets

(51) Int. Cl.
*H03H 9/13* (2006.01)
*H03H 9/17* (2006.01)
*H03H 9/54* (2006.01)

(58) Field of Classification Search
CPC ........... H03H 9/02559; H03H 9/02834; H03H 9/02866; H03H 9/02574
USPC .................................................. 333/193–196
See application file for complete search history.

(56) References Cited

U.S. PATENT DOCUMENTS

| | | | |
|---|---|---|---|
| 2019/0288661 A1 | 9/2019 | Akiyama et al. | .. H03H 9/02614 |
| 2019/0326878 A1 | 10/2019 | Kakita et al. | ...... H03H 9/02574 |
| 2020/0304094 A1* | 9/2020 | Nagatomo | ......... H03H 9/02015 |
| 2020/0313650 A1 | 10/2020 | Yamamoto et al. | ..... H03H 9/25 |
| 2020/0389148 A1 | 12/2020 | Vo et al. | |
| 2021/0175871 A1* | 6/2021 | Komiyama | ........ H03H 9/02866 |

FOREIGN PATENT DOCUMENTS

| | | |
|---|---|---|
| JP | 2006-025396 A | 1/2006 |
| JP | 2015-115870 A | 6/2015 |
| JP | 2018-061258 A | 4/2018 |
| JP | 2019-201345 A | 11/2019 |
| JP | 2020-510354 A | 4/2020 |
| JP | 2020-161899 A | 10/2020 |

* cited by examiner

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2020-104639, filed on Jun. 17, 2020, the entire contents of which are incorporated herein by reference.

FIELD

A certain aspect of the present embodiments relates to an acoustic wave device, a filter, and a multiplexer.

BACKGROUND

Surface acoustic wave resonators have been known as acoustic wave resonators used in communication devices such as smartphones. It is known to attach a piezoelectric layer forming the surface acoustic wave resonator to a support substrate. It is known to provide a temperature compensation film between the piezoelectric layer and the support substrate as disclosed in, for example, Japanese Patent Application Publication No. 2019-201345 (Patent Document 1). It is known to provide a low acoustic velocity film, which has a lower acoustic velocity than the piezoelectric layer, between the piezoelectric layer and the support substrate, and provide a high acoustic velocity film, which has a higher acoustic velocity than the piezoelectric layer, between the low acoustic velocity film and the support substrate as disclosed in, for example, Japanese Patent Application Publication No. 2015-115870 (Patent Document 2). It is known to provide an intervening layer containing silica between a piezoelectric substrate and a support substrate, and configure both a boundary face between the intervening layer and the piezoelectric substrate and a boundary face between the intervening layer and the support substrate to be uneven as disclosed in, for example, Japanese Patent Application Publication No. 2018-061258 (Patent Document 3).

SUMMARY

When the high acoustic velocity film, which has a higher acoustic velocity than the piezoelectric layer, is interposed between the low acoustic velocity film and the support substrate, acoustic waves are confined within the piezoelectric layer and the low acoustic velocity film. In addition, spurious emissions can be reduced by adjusting the thickness of the high acoustic velocity film to be a desired thickness. However, reduction of spurious emissions is insufficient.

The objective of the present disclosure is to reduce spurious emissions in an acoustic wave device.

According to a first aspect of the present disclosure, there is provided an acoustic wave device including: a support substrate; a piezoelectric layer provided over the support substrate; at least one pair of comb-shaped electrodes disposed on the piezoelectric layer, each of the at least one pair of comb-shaped electrodes including electrode fingers; a temperature compensation film interposed between the support substrate and the piezoelectric layer, the temperature compensation film having a temperature coefficient of elastic constant opposite in sign to a temperature coefficient of elastic constant of the piezoelectric layer; and an insulating layer interposed between the support substrate and the temperature compensation film, a first surface of the insulating layer having a plurality of first protruding portions and/or a plurality of first recessed portions, a second surface of the insulating layer having a plurality of second protruding portions and/or a plurality of second recessed portions, the first surface being closer to the support substrate, the second surface being closer to the temperature compensation film.

According to a second aspect of the present disclosure, there is provided a filter including the above acoustic wave device.

According a third aspect of the present disclosure, there is provided a multiplexer including the above filter.

DETAILED DESCRIPTION

Hereinafter, a description will be given of embodiments of the present disclosure with reference to the accompanying drawings.

First Embodiment

Figure 1A:
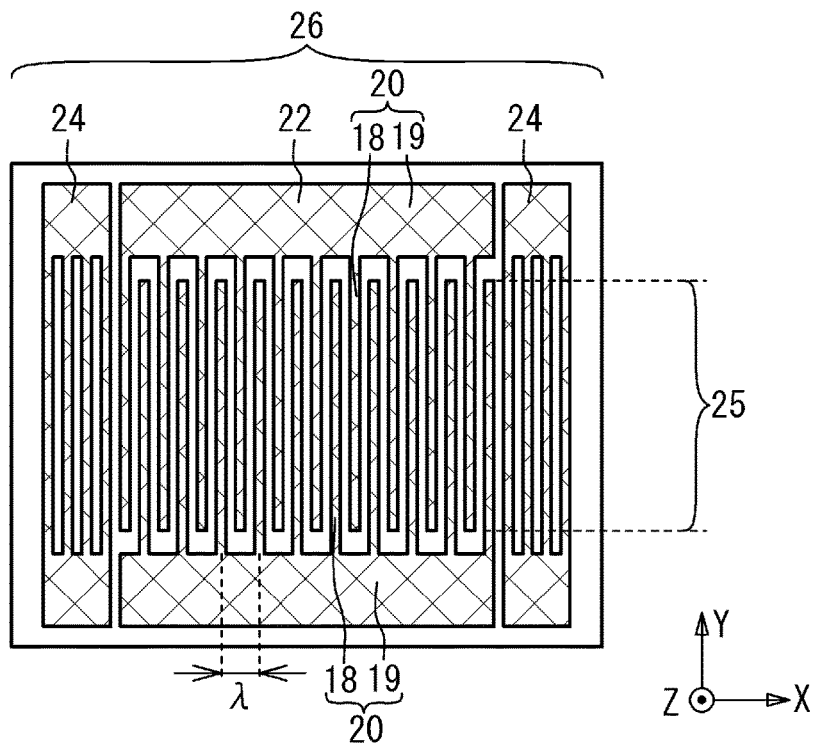
FIG. 1A is a plan view of an acoustic wave resonator in a first embodiment.
Figure 1B:
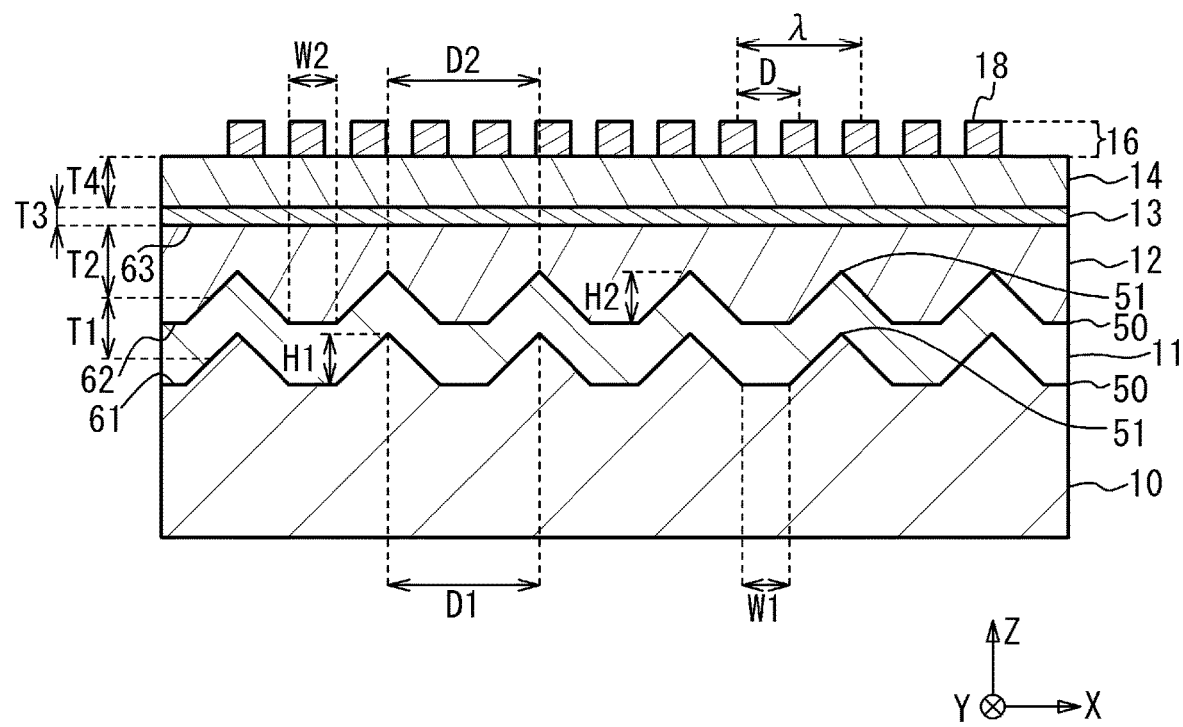
FIG. 1B is a cross-sectional view of the acoustic wave resonator in the first embodiment.

A first embodiment describes an example where an acoustic wave device includes an acoustic wave resonator. FIG. 1A is a plan view of an acoustic wave resonator in the first embodiment, and FIG. 1B is a cross-sectional view of the acoustic wave resonator in the first embodiment. The direction in which electrode fingers are arranged is defined as an X direction, the direction in which the electrode fingers extend (the extension direction of the electrode fingers) is defined as a Y direction, and the direction in which a support substrate and a piezoelectric layer are stacked (the stack direction of the support substrate and the piezoelectric layer) is defined as a Z direction. The X direction, the Y direction, and the Z direction do not necessarily correspond to the X-axis orientation or the Y-axis orientation of the crystal orientation of the piezoelectric layer. When the piezoelectric layer is a rotated Y-cut X-propagation substrate, the X direction is the X-axis orientation of the crystal orientation.

As illustrated in FIG. 1A and FIG. 1B, a piezoelectric layer 14 is provided over a support substrate 10. A temperature compensation film 12 is interposed between the support substrate 10 and the piezoelectric layer 14. A boundary layer 11 (an insulating layer) is interposed between the temperature compensation film 12 and the support substrate 10. A bonding layer 13 is interposed between the temperature compensation film 12 and the piezoelectric layer 14. A first surface, which is provided closer to the support substrate 10, of the boundary layer 11 is a surface 61. A second surface, which is provided closer to the temperature compensation film 12, of the boundary layer 11 is a surface 62. A surface closer to the piezoelectric layer 14 of the temperature compensation film 12, is a surface 63.

The surface 61 is a boundary face between the boundary layer 11 and the support substrate 10, and is uneven. The surface 62 is a boundary face between the boundary layer 11 and the temperature compensation film 12, and is uneven. The surface 63 is a boundary face between the temperature compensation film 12 and the piezoelectric layer 14 or a boundary face between the temperature compensation film 12 and the bonding layer 13, and is flat. The unevenness of the surface 61 is formed along the unevenness of the surface 62. A plurality of protruding portions 51 are protruded from a flat surface 50 of each of the surfaces 61 and 62. The protruding portions 51 are regularly arranged.

The regular interval between the protruding portions 51 of the surface 61 is represented by D1, and the regular interval between the protruding portions 51 of the surface 62 is represented by D2. The height of the protruding portions 51 of the surface 61 is represented by H1, and the height of the protruding portions 51 of the surface 62 is represented by H2. The distance between the protruding portions 51 of the surface 61 is represented by W1, and the distance between the protruding portions 51 of the surface 62 is represented by W2. The regular intervals D1 and D2 are substantially the same, the heights H1 and H2 are substantially the same, and the distances W1 and W2 are substantially the same. The positions of the protruding portions 51 of the surfaces 61 and 62 are substantially the same (that is, the phases thereof are substantially the same). The term "substantially the same" means that the difference to the extent of manufacturing errors is acceptable. For example, a difference of 10% or less, or a difference of 1% or less is acceptable. For example, an acceptance of 1% or less of the difference between D1 and D2 means $2\times|D1-D2|/(D1+D2)\times100\% \leq 1\%$. The thicknesses of the boundary layer 11, the temperature compensation film 12, the bonding layer 13, and the piezoelectric layer 14 are respectively represented by T1, T2, T3, and T4. Since the thickness of the boundary layer 11 and the thickness of the temperature compensation film 12 are not uniform, the thickness T1 is an average thickness of the boundary layer 11 and the thickness T2 is an average thickness of the temperature compensation film 12.

An acoustic wave resonator 26 is disposed on the piezoelectric layer 14. The acoustic wave resonator 26 includes an interdigital transducer (IDT) 22 and reflectors 24. The reflectors 24 are located at both sides of the IDT 22 in the X direction. The IDT 22 and the reflectors 24 are formed of a metal film 16 on the piezoelectric layer 14.

The IDT 22 includes a pair of comb-shaped electrodes 20 opposite to each other. The comb-shaped electrode 20 includes a plurality of electrode fingers 18 and a bus bar 19 to which the electrode fingers 18 are coupled. An overlap region 25 is a region where the electrode fingers 18 of one of the pair of the comb-shaped electrodes 20 overlap with the electrode fingers 18 of the other of the pair of the comb-shaped electrodes 20. The length of the overlap region 25 is an aperture length. The pair of comb-shaped electrodes 20 is located to face each other such that the electrode fingers 18 of one of the pair of the comb-shaped electrodes 20 and the electrode fingers 18 of the other of the pair of the comb-shaped electrodes 20 are substantially alternately arranged in at least a part of the overlap region 25. In the overlap region 25, the acoustic wave excited by the electrode fingers 18 propagates mainly in the X direction. The pitch of the electrode fingers 18 of one of the pair of the comb-shaped electrodes 20 is approximately equal to the wavelength λ of the acoustic wave. When the pitch of the electrode fingers 18 (the pitch between the centers of the electrode fingers 18) is represented by D, the pitch of the electrode fingers 18 of one of the pair of the comb-shaped electrodes 20 is equal to two times the pitch D. The reflectors 24 reflect the acoustic wave (the surface acoustic wave) excited by the electrode fingers 18 of the IDT 22. Thus, the acoustic wave is confined within the overlap region 25 of the IDT 22.

The piezoelectric layer 14 is, for example, a monocrystalline lithium tantalate ($LiTaO_3$) layer or a monocrystalline lithium niobate ($LiNbO_3$) layer, and is, for example, a rotated Y-cut X-propagation lithium tantalate layer or a rotated Y-cut X-propagation lithium niobate layer.

The support substrate 10 is, for example, a sapphire substrate, a silicon substrate, a spinel substrate, a quartz substrate, a crystal substrate, an alumina substrate, or a silicon carbide substrate. The sapphire substrate is a monocrystalline $Al_2O_3$ substrate. The silicon substrate is a monocrystalline or polycrystalline silicon substrate. The spinel substrate is a polycrystalline $MgAl_2O_4$ substrate. The quartz substrate is an amorphous $SiO_2$ substrate. The crystal substrate is a monocrystalline $SiO_2$ substrate. The alumina substrate is a polycrystalline or amorphous $Al_2O_3$ substrate. The silicon carbide substrate is a polycrystalline or monocrystalline SiC substrate. The linear expansion coefficient in the X direction of the support substrate 10 is less than the linear expansion coefficient in the X direction of the piezoelectric layer 14. Therefore, the frequency temperature dependence of the acoustic wave resonator can be reduced.

The temperature compensation film 12 has a temperature coefficient of elastic constant opposite in sign to the temperature coefficient of elastic constant of the piezoelectric layer 14. For example, the temperature coefficient of elastic constant of the piezoelectric layer 14 has a negative value, while the temperature coefficient of elastic constant of the temperature compensation film 12 has a positive value. The temperature compensation film 12 is, for example, an additive-free silicon oxide ($SiO_2$) film or a silicon oxide ($SiO_2$) film containing additive elements such as fluorine, and is, for example, an amorphous layer. Therefore, the frequency temperature coefficient of the acoustic wave resonator can be reduced. When the temperature compensation film 12 is a silicon oxide film, the acoustic velocity of the bulk wave propagating through the temperature compensation film 12 is less than the acoustic velocity of the bulk wave propagating through the piezoelectric layer 14.

The acoustic velocity of the bulk wave propagating through the boundary layer 11 is greater than the acoustic velocity of the bulk wave propagating through the temperature compensation film 12. Therefore, the acoustic wave is confined within the piezoelectric layer 14 and the temperature compensation film 12. Furthermore, the acoustic velocity of the bulk wave propagating through the boundary layer 11 is less than the acoustic velocity of the bulk wave propagating through the support substrate 10. The boundary layer 11 is, for example, polycrystalline or amorphous, and is an insulating layer such as an aluminum oxide film, a silicon film, an aluminum nitride film, a silicon nitride film, or a silicon carbide film. A plurality of layers of which the materials are different from each other may be provided as the boundary layer 11.

The acoustic velocity of the bulk wave propagating through the bonding layer 13 is greater than the acoustic velocity of the bulk wave propagating through the temperature compensation film 12. The bonding layer 13 is, for example, polycrystalline or amorphous, and is, for example, an aluminum oxide film, a silicon film, an aluminum nitride film, a silicon nitride film, or a silicon carbide film.

The metal film 16 is a film mainly composed of, for example, aluminum (Al), copper (Cu), or molybdenum (Mo). An adhesion film such as a titanium (Ti) film or a chrome (Cr) film may be interposed between the electrode fingers 18 and the piezoelectric layer 14. The adhesion film is thinner than the electrode fingers 18. An insulating film may be provided so as to cover the electrode fingers 18. The insulating film serves as a protective film or a temperature compensation film.

The wavelength λ of the acoustic wave is, for example, 1 μm to 6 μm. When two electrode fingers 18 are defined as a pair, the number of pairs is, for example, 20 pairs to 300 pairs. The duty ratio of the IDT 22 is the value calculated by dividing the width of the electrode finger 18 by the pitch of the electrode fingers 18, and is, for example, 30% to 70%. The aperture length of the IDT 22 is, for example, 10λ to 50λ.

The IDT 22 excites the surface acoustic wave that is the primary mode within the piezoelectric layer 14. The IDT 22 also excites unnecessary waves such as the bulk wave at this time. The energy of the surface acoustic wave exists in the section from the upper surface of the piezoelectric layer 14 to a depth of approximately 2λ (λ is the wavelength of the acoustic wave), particularly exists in the section from the upper surface of the piezoelectric layer 14 to a depth of λ. On the other hand, the unnecessary wave such as the bulk wave exists in the section from the upper surface of the piezoelectric layer 14 to a depth of 10λ or greater. When the unnecessary wave downwardly propagates through the layers, the energy of the acoustic wave leaks, and the loss of the acoustic wave increases. Meanwhile, when the bulk wave is reflected by the boundary faces between the layers from the piezoelectric layer 14 to the support substrate 10 and returns to the IDT 22, the returned bulk wave causes spurious emissions.

Simulation

When the surfaces 61 and 62 are configured to be uneven, the bulk wave, which is the unnecessary wave, may be scattered by the surfaces 61 and 62, and spurious emissions may be thereby reduced. Therefore, simulated was the magnitudes of spurious emissions in first and second comparative examples and the first embodiment as follows.

Comparative Examples

Figure 2A:
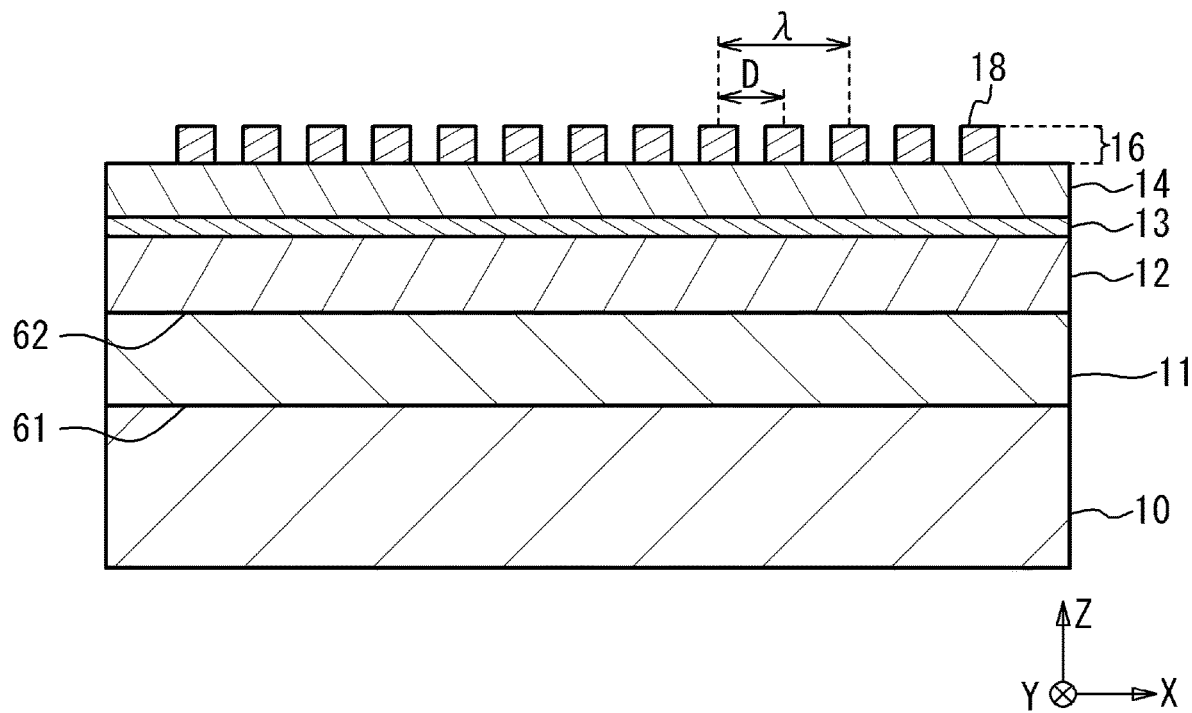
FIG. 2A is a cross-sectional view of an acoustic wave resonator in accordance with a first comparative example.
Figure 2B:
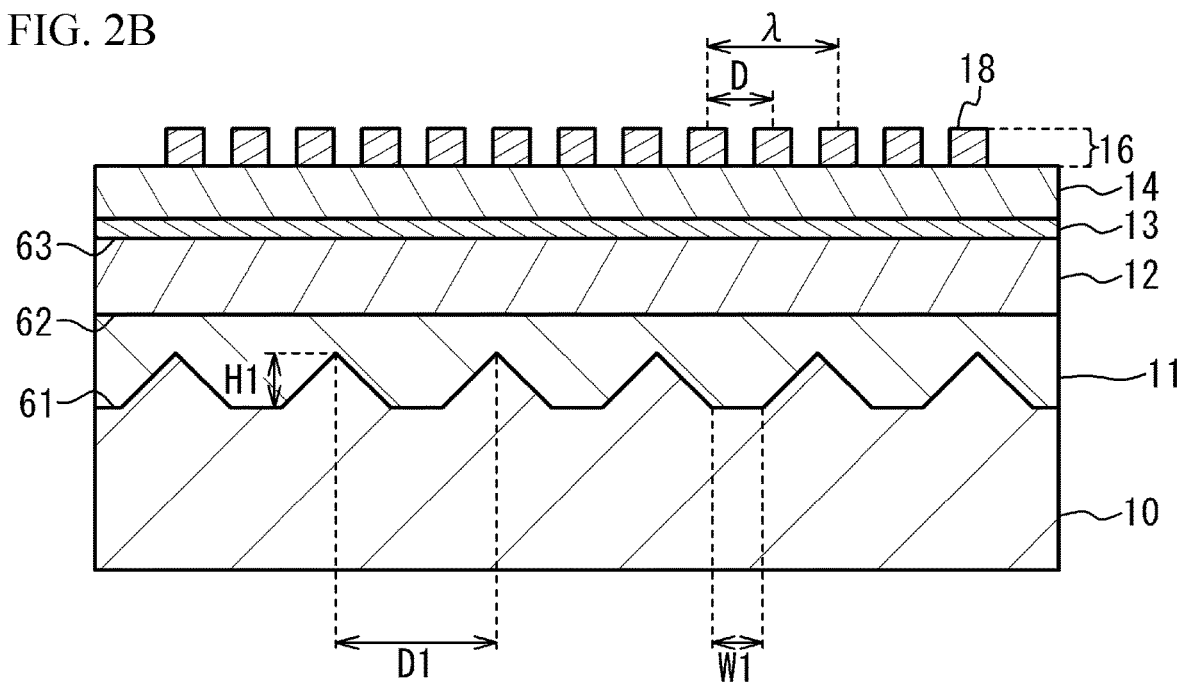
FIG. 2B is a cross-sectional view of an acoustic wave resonator in accordance with a second comparative example.

FIG. 2A is a cross-sectional view of an acoustic wave resonator in accordance with the first comparative example, and FIG. 2B is a cross-sectional view of an acoustic wave resonator in accordance with the second comparative example. As illustrated in FIG. 2A, the surface 61, which is closer to the support substrate 10, of the boundary layer 11 and the surface 62, which is closer to the temperature compensation film 12, of the boundary layer 11 are flat in the first comparative example. Other structures are the same as those of the first embodiment. As illustrated in FIG. 2B, the surface 62, which is closer to the temperature compensation film 12, of the boundary layer 11 is flat in the second comparative example. Other structures are the same as those of the first embodiment.

Simulation conditions are as follows.
Wavelength λ of the acoustic wave: 5 μm
Support substrate 10: Sapphire substrate
Boundary layer 11: Aluminum oxide film with a thickness T1 of 0.3λ
Temperature compensation film 12: Silicon oxide film with a thickness T2 of 0.3λ
Bonding layer 13: not provided
Piezoelectric layer 14: 42° rotated Y-cut X-propagation lithium tantalate substrate with a thickness T4 of 0.3λ
Metal film 16: Aluminum film with a thickness of 0.1λ
Heights H1 and H2 of the protruding portion 51: 0.5λ
Regular intervals D1 and D2 between the protruding portions 51: 0.8λ
Distances W1 and W2 between the protruding portions 51: 0.02λ

Figure 3A:
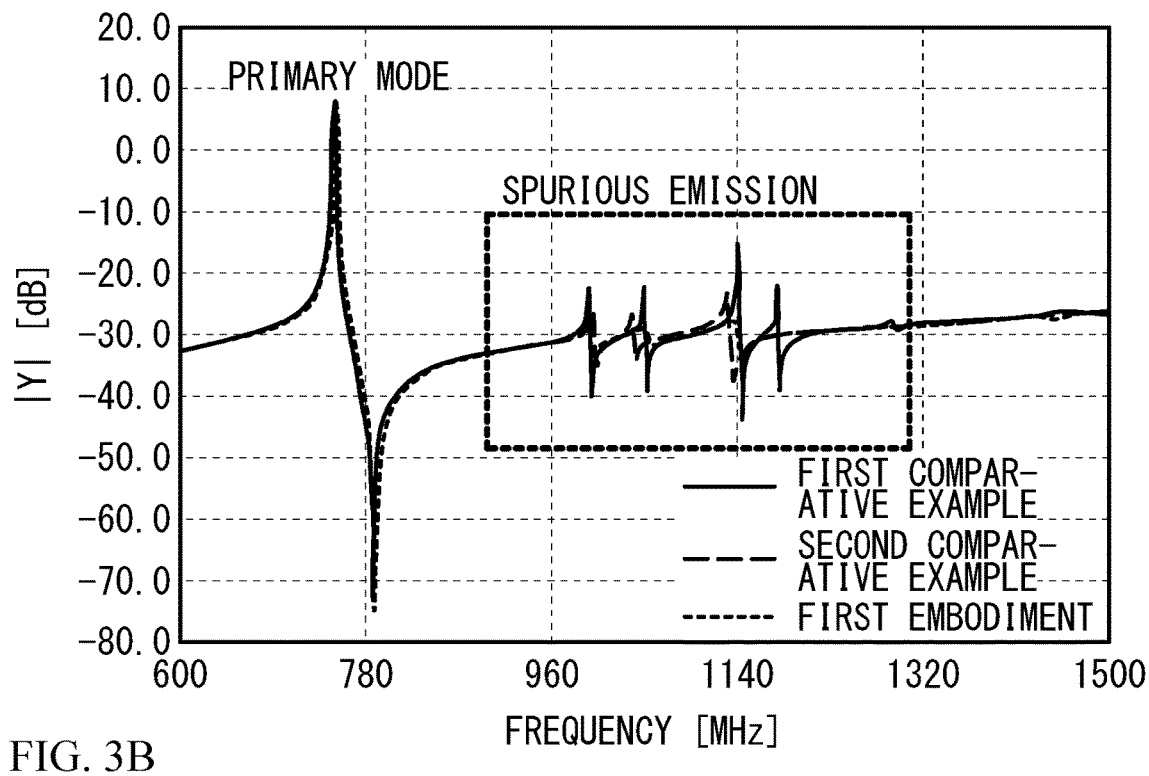
FIG. 3A is a graph of admittance |Y| versus frequency in the first embodiment, the first comparative example, and the second comparative example.
Figure 3B:
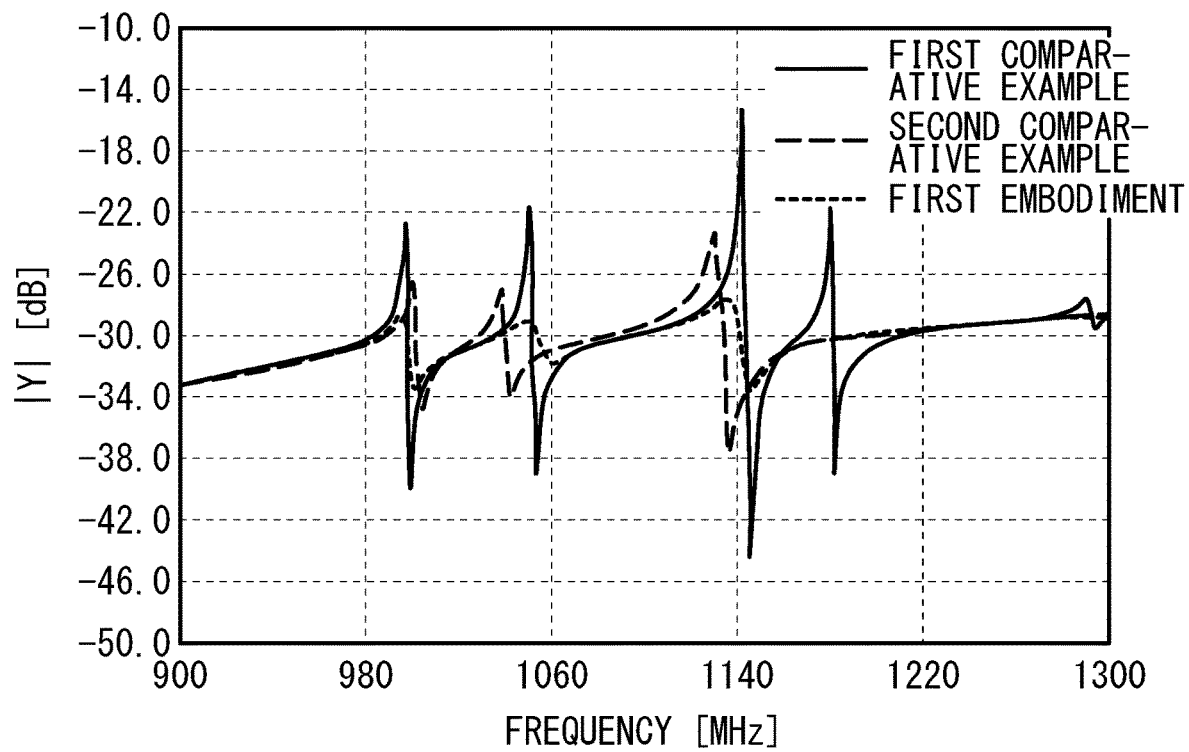
FIG. 3B is an enlarged graph of FIG. 3A.

FIG. 3A is a graph of admittance |Y| versus frequency in the first and second comparative examples and the first embodiment, and FIG. 3B enlarges an area surrounded by broken lines in FIG. 3A. As presented in FIG. 3A, the response due to the surface acoustic wave that is the primary mode is almost the same among the first and second comparative examples and the first embodiment. As presented in FIG. 3B, the magnitude of the spurious response in the second comparative example is smaller than that of the first comparative example, and the magnitude of the spurious response in the first embodiment is smaller than that of the second comparative example.

When the surface 61 is configured to be uneven as in the second comparative example, the magnitude of the spurious response is less than that in the first comparative example of which the surface 61 is flat. Moreover, when the surfaces 61 and 62 are configured to be uneven as in the first embodiment, the magnitude of the spurious response is less than that in the second comparative example. As is clear from the above, when the surfaces 61 and 62 are both configured to be uneven, the magnitude of the spurious response can be reduced.

Figure 4A:
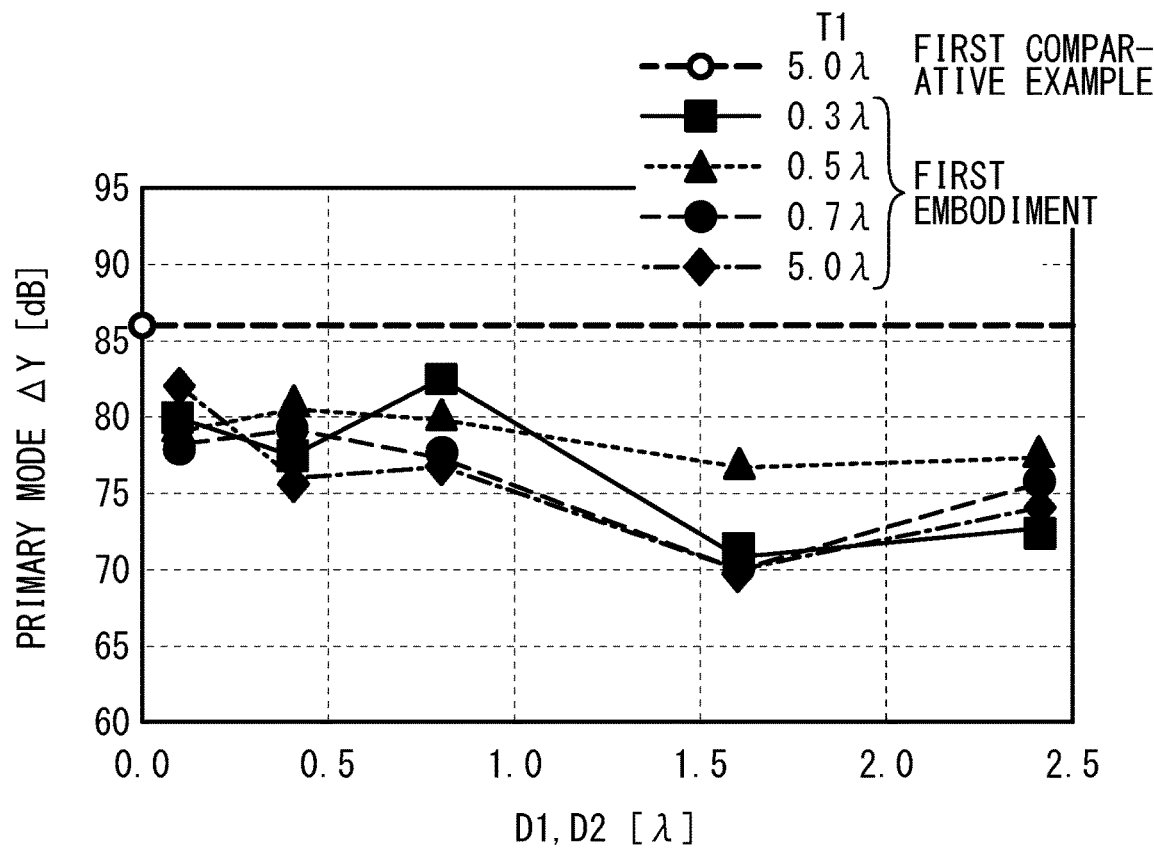
FIG. 4A is a graph of ΔY in a primary mode in the first embodiment and FIG. 4B is a graph of ΔY in spurious emissions.
Figure 4B:
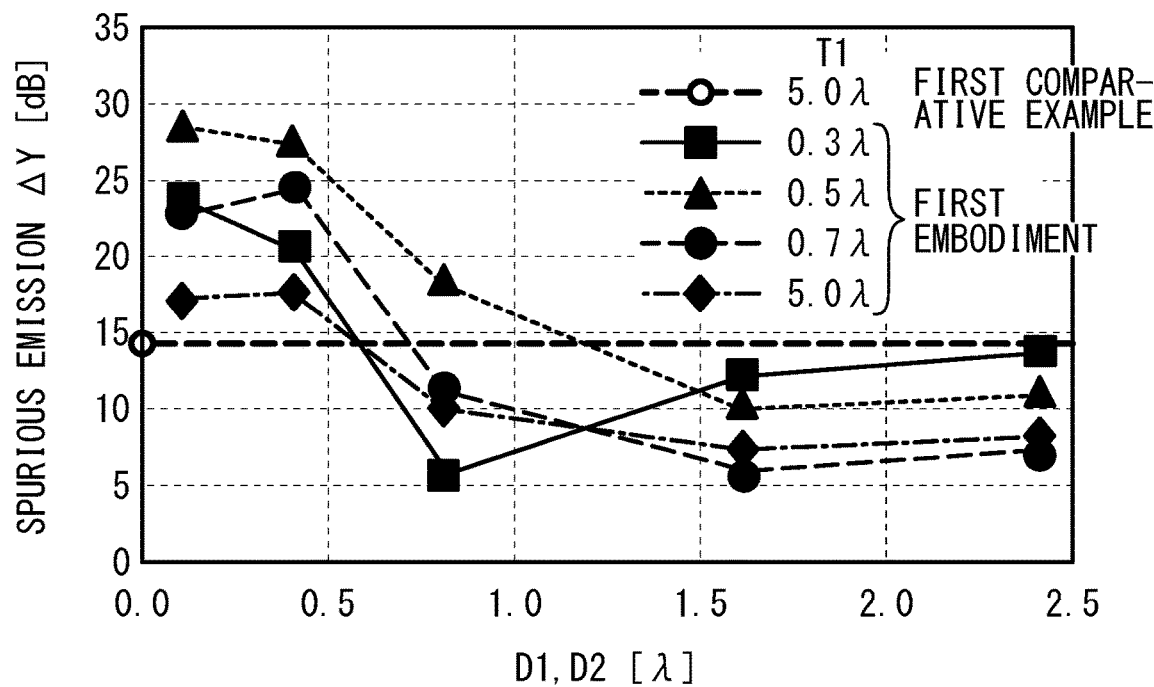

A simulation was conducted for different regular intervals D1 between the protruding portions 51, different regular intervals D2 between the protruding portions 51, and different thicknesses T1 of the boundary layer 11 in the first embodiment. FIG. 4A is a graph of ΔY in the primary mode in the first embodiment, and FIG. 4B is a graph of ΔY in the spurious emission in the first embodiment. The primary mode ΔY represented by the vertical axis is the value obtained by subtracting the smallest value of |Y| [dB] in the primary mode from the largest value of |Y| [dB] in the primary mode. The spurious emission ΔY represented by the vertical axis is the value obtained by subtracting the smallest value of |Y| [dB] in the spurious emission from the largest value of |Y| [dB] in the spurious emission. The horizontal axis represents the regular interval D1 between the protruding portions 51 and the regular interval D2 between the protruding portions 51. In the first comparative example, the thickness of the boundary layer 11 was configured to be 5.0λ, while the thickness of the boundary layer 11 was configured to be 0.3λ, 0.5λ, 0.7λ, and 5.0λ in the first embodiment.

As presented in FIG. 4A, in the response due to the primary mode, ΔY of the first embodiment is smaller than that of the first comparative example. In particular, when the regular interval D1 between the protruding portions 51 and the regular interval D2 between the protruding portions 51 is 1.6λ or greater, ΔY of the first embodiment decreases. Even when the thickness T1 of the boundary layer 11 is varied, ΔY of the first embodiment is little changed. As presented in FIG. 4B, in the response due to the spurious emissions, when the thickness T1 of the boundary layer 11 is 0.7λ or greater and the regular interval D1 between the protruding portions 51 and the regular interval D2 between the protruding portions 51 are 0.8λ or greater, ΔY of the first embodiment is smaller than that of the first comparative example.

As is clear from the above, the spurious emissions can be reduced by optimizing the regular interval D1 between the protruding portions 51, the regular interval D2 between the protruding portions 51, and the thickness T1 of the boundary layer 11. In addition, when another simulation was conducted under the condition where the heights H1 and H2 of the protruding portion 51 were configured to be 0.25λ, ΔY in the primary mode and ΔY in the spurious emission were almost the same as those when the heights H1 and H2 of the protruding portion 51 were configured to be 0.5λ.

First Variation of the First Embodiment

Figure 5A:
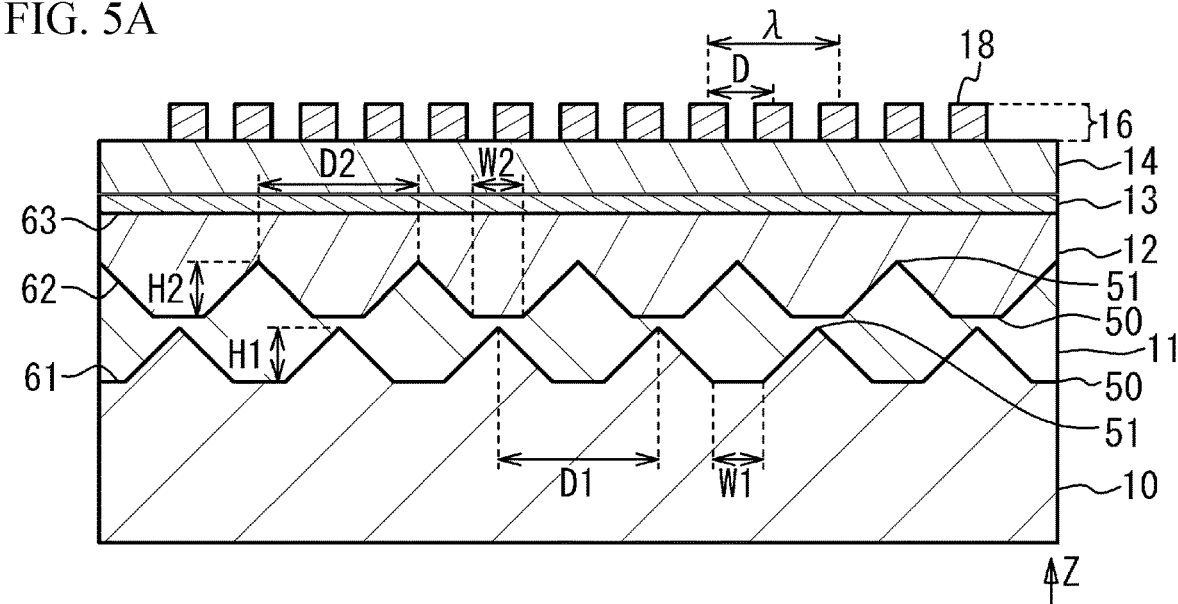
FIG. 5A to FIG. 5C are cross-sectional views of acoustic wave resonators in accordance with first to third variations of the first embodiment, respectively.

FIG. 5A is a cross-sectional view of an acoustic wave resonator in accordance with a first variation of the first embodiment. As illustrated in FIG. 5A, the regular intervals D1 and D2 are substantially the same, the heights H1 and H2 are substantially the same, and the distances W1 and W2 are substantially the same. The positions of the protruding portions 51 of the surface 61 differ from the positions of the protruding portions 51 of the surface 62 (that is, the phase of the protruding portions 51 of the surface 61 differs from the phase of the protruding portions 51 of the surface 62). Other structures are the same as those of the first embodiment, and the description thereof is thus omitted. As in the first variation of the first embodiment, the phase of unevenness of the surface 61 may be different from that of the surface 62.

Second Variation of the First Embodiment

Figure 5B:
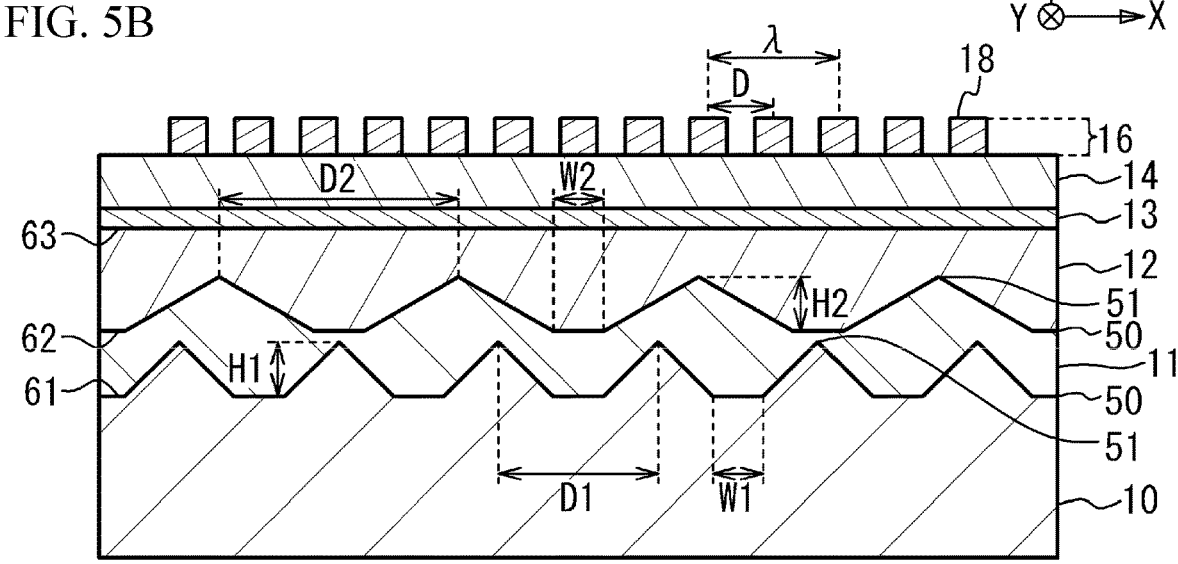

FIG. 5B is a cross-sectional view of an acoustic wave resonator in accordance with a second variation of the first embodiment. As illustrated in FIG. 5B, the regular interval D2 between the protruding portions 51 of the surface 62 is greater than the regular interval D1 between the protruding portions 51 of the surface 61. The heights H1 and H2 are substantially the same, and the distances W1 and W2 are substantially the same. Other structures are the same as those of the first embodiment, and the description thereof is thus omitted.

Third Variation of the First Embodiment

Figure 5C:
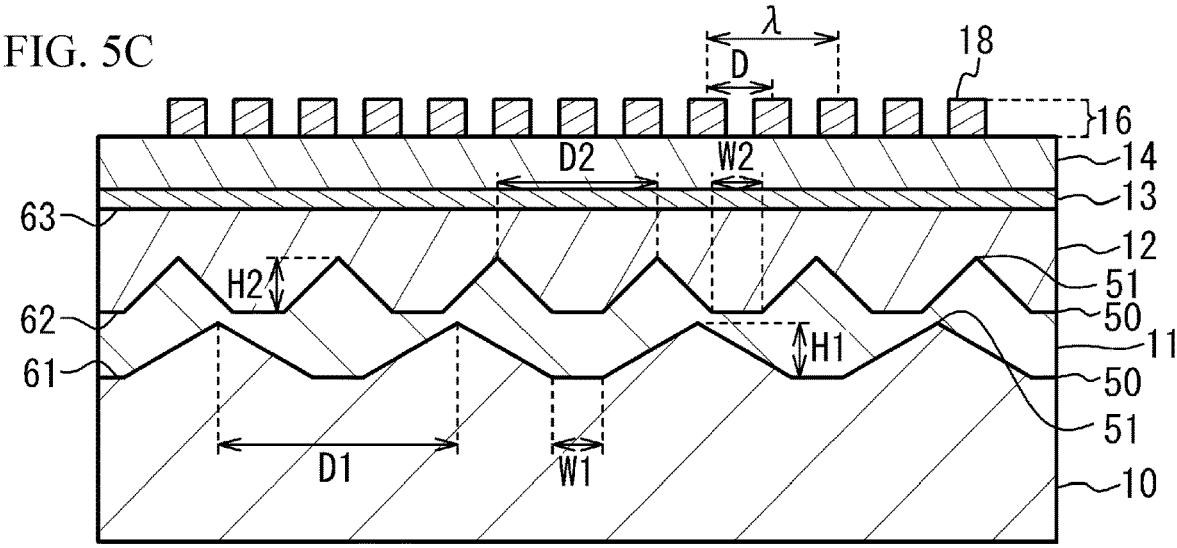

FIG. 5C is a cross-sectional view of an acoustic wave resonator in accordance with a third variation of the first embodiment. As illustrated in FIG. 5C, the regular interval D1 between the protruding portions 51 of the surface 61 is greater than the regular interval D2 between the protruding portions 51 of the surface 62. The heights H1 and H2 are substantially the same, and the distances W1 and W2 are substantially the same. Other structures are the same as those of the first embodiment, and the description thereof is thus omitted. As in the second and third variations of the first embodiment, the regular interval D1 between the protruding portions 51 of the surface 61 may be different from the regular interval D2 between the protruding portions 51 of the surface 62.

Fourth Variation of the First Embodiment

Figure 6A:
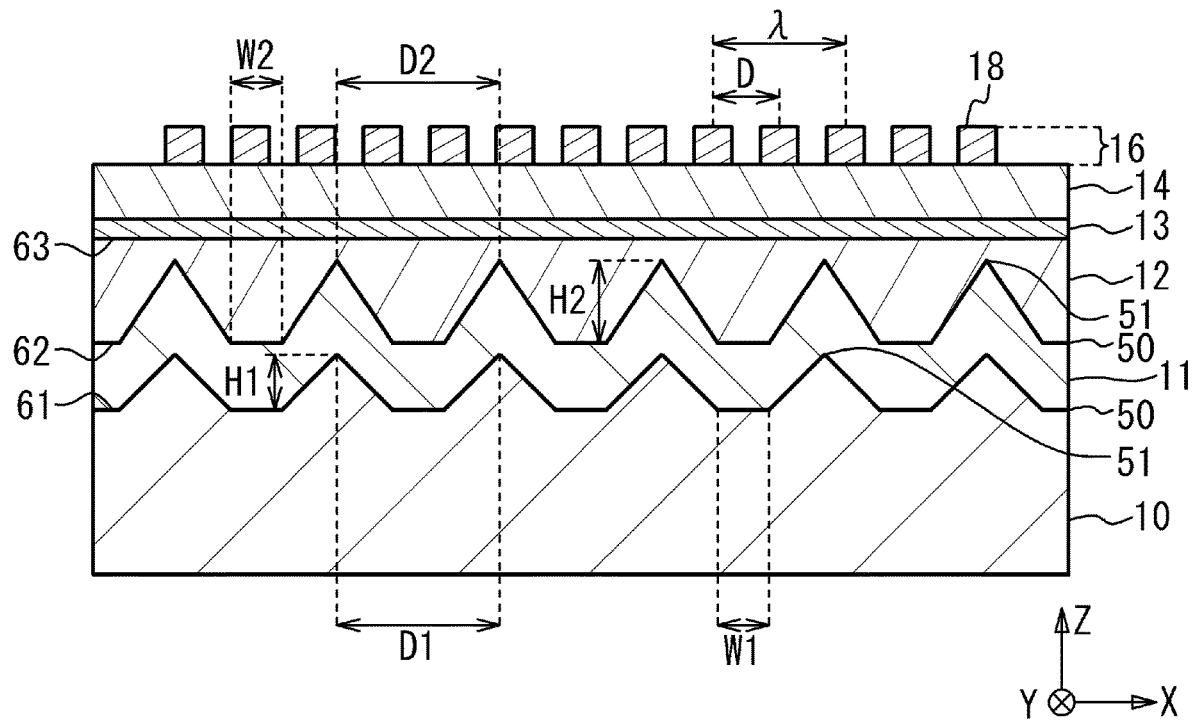
FIG. 6A and FIG. 6B are cross-sectional views of acoustic wave resonators in accordance with fourth and fifth variations of the first embodiment, respectively.

FIG. 6A is a cross-sectional view of an acoustic wave resonator in accordance with a fourth variation of the first embodiment. As illustrated in FIG. 6A, the height H2 of the protruding portion 51 of the surface 62 is greater than the height H1 of the protruding portion 51 of the surface 61. The regular intervals D1 and D2 are substantially the same, and the distances W1 and W2 are substantially the same. The positions of the protruding portions 51 of the surfaces 61 and 62 are the substantially the same. Other structures are the same as those of the first embodiment, and the description thereof is thus omitted.

Fifth Variation of the First Embodiment

Figure 6B:
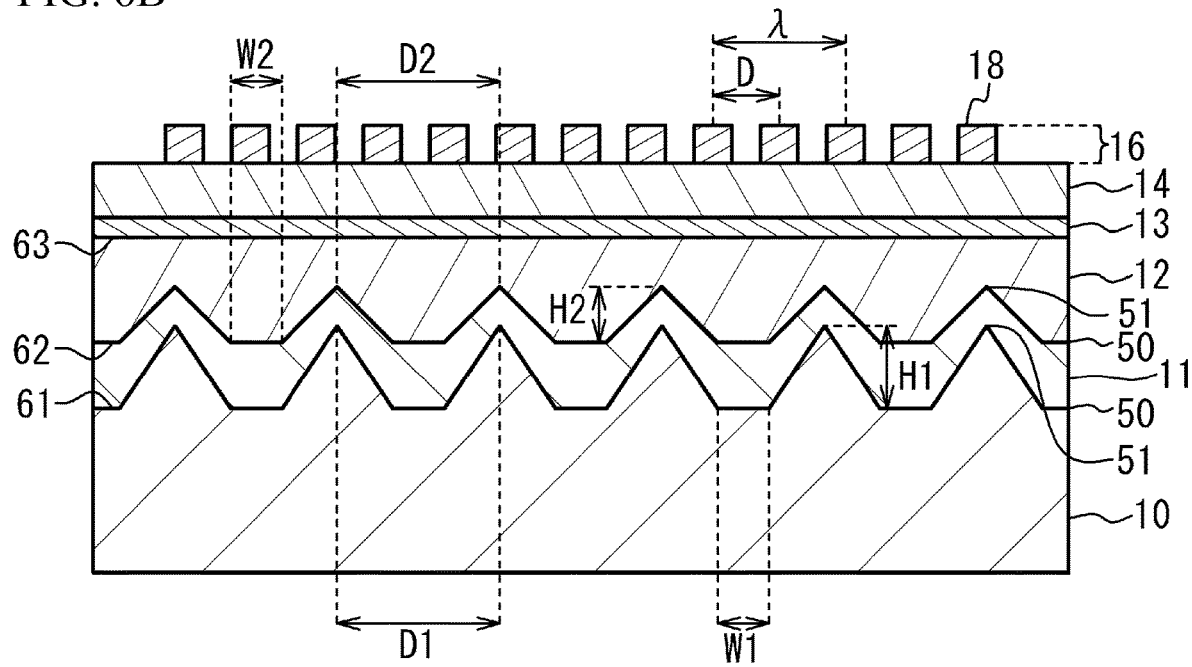

FIG. 6B is a cross-sectional view of an acoustic wave resonator in accordance with a fifth variation of the first embodiment. As illustrated in FIG. 6B, the height H1 of the protruding portion 51 of the surface 61 is greater than the height H2 of the protruding portion 51 of the surface 62. The regular intervals D1 and D2 are substantially the same, and the distances W1 and W2 are substantially the same. The positions of the protruding portions 51 of the surfaces 61 and 62 are the substantially the same. Other structures are the same as those of the first embodiment, and the description thereof is thus omitted. As in the fourth and fifth variations of the first embodiment, the height H1 of the protruding portion 51 of the surface 61 may be different from the height H2 of the protruding portion 51 of the surface 62.

Sixth Variation of the First Embodiment

Figure 7A:
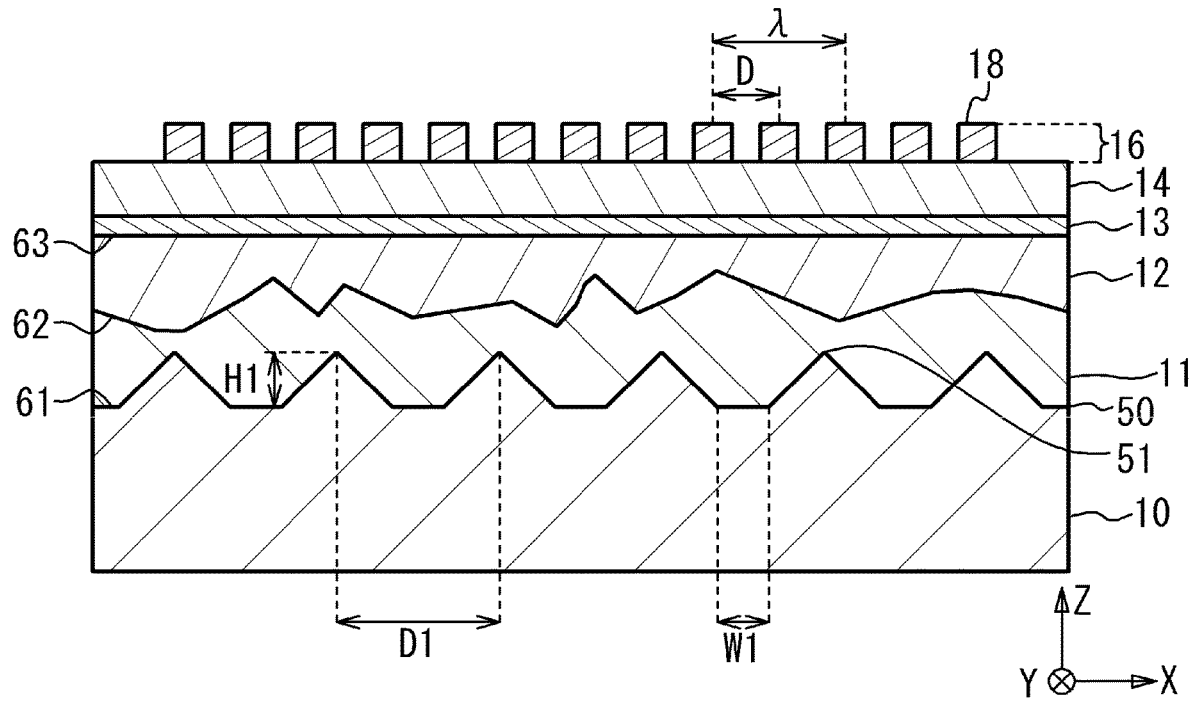
FIG. 7A and FIG. 7B are cross-sectional views of acoustic wave resonators in accordance with sixth and seventh variations of the first embodiment, respectively.

FIG. 7A is a cross-sectional view of an acoustic wave resonator in accordance with a sixth variation of the first embodiment. As illustrated in FIG. 7A, the surface 61 is regularly protruded and recessed, while the surface 62 is irregularly protruded and recessed. Other structures are the same as those of the first embodiment, and the description thereof is thus omitted.

Seventh Variation of the First Embodiment

Figure 7B:
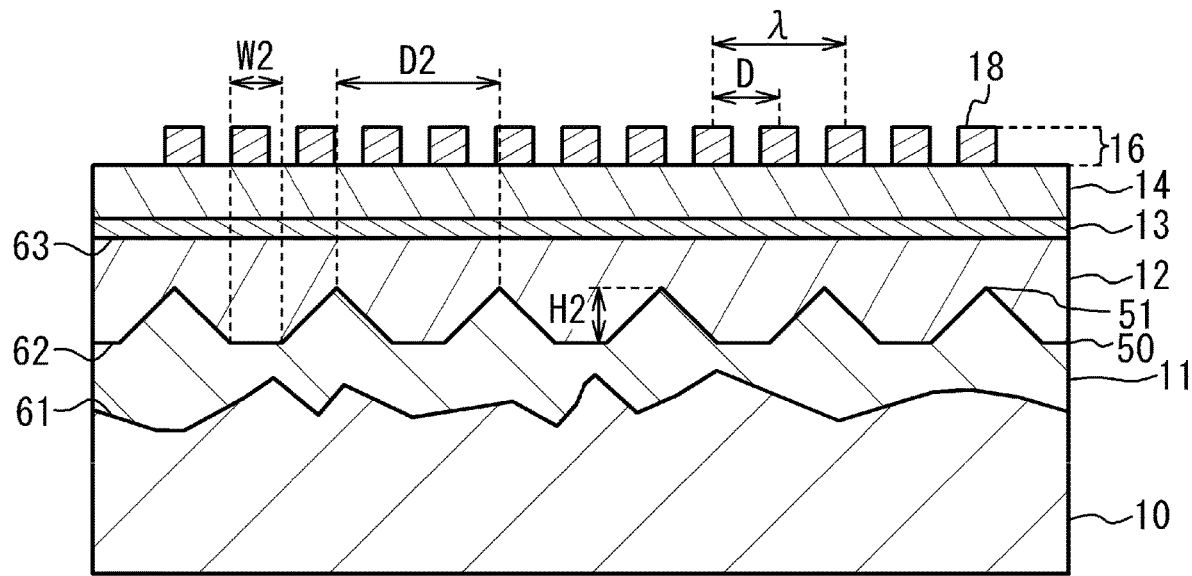

FIG. 7B is a cross-sectional view of an acoustic wave resonator in accordance with a seventh variation of the first embodiment. As illustrated in FIG. 7B, the surface 61 is irregularly protruded and recessed, while the surface 62 is regularly protruded and recessed. Other structures are the same as those of the first embodiment, and the description thereof is thus omitted. As in the sixth and seventh variations of the first embodiment, one of the surfaces 61 and 62 may be regularly protruded and recessed, while the other of the surfaces 61 and 62 may be irregularly protruded and recessed.

Eighth Variation of the First Embodiment

Figure 8A:
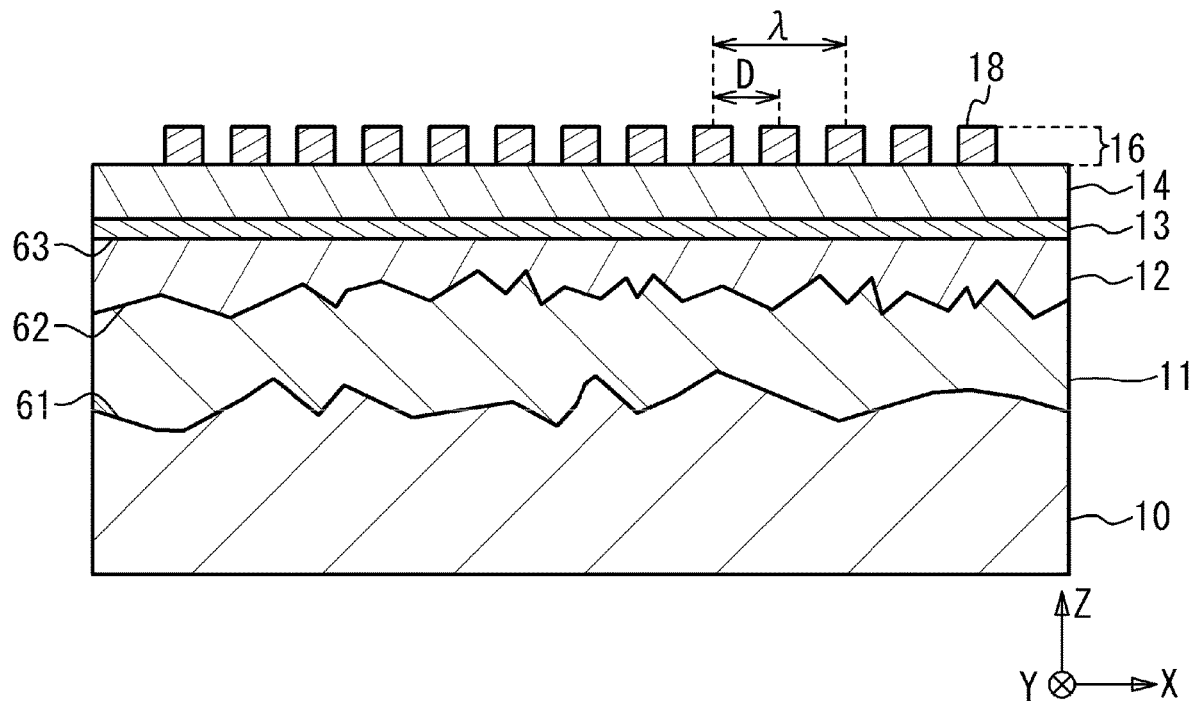
FIG. 8A and FIG. 8B are cross-sectional views of acoustic wave resonators in accordance with eighth and ninth variations of the first embodiment, respectively.

FIG. 8A is a cross-sectional view of an acoustic wave resonator in accordance with an eighth variation of the first embodiment. As illustrated in FIG. 8A, each of the surfaces 61 and 62 is irregularly protruded and recessed. The surface roughness of the surface 62 is greater than the surface roughness of the surface 61. Other structures are the same as those of the first embodiment, and the description thereof is thus omitted.

Ninth Variation of the First Embodiment

Figure 8B:
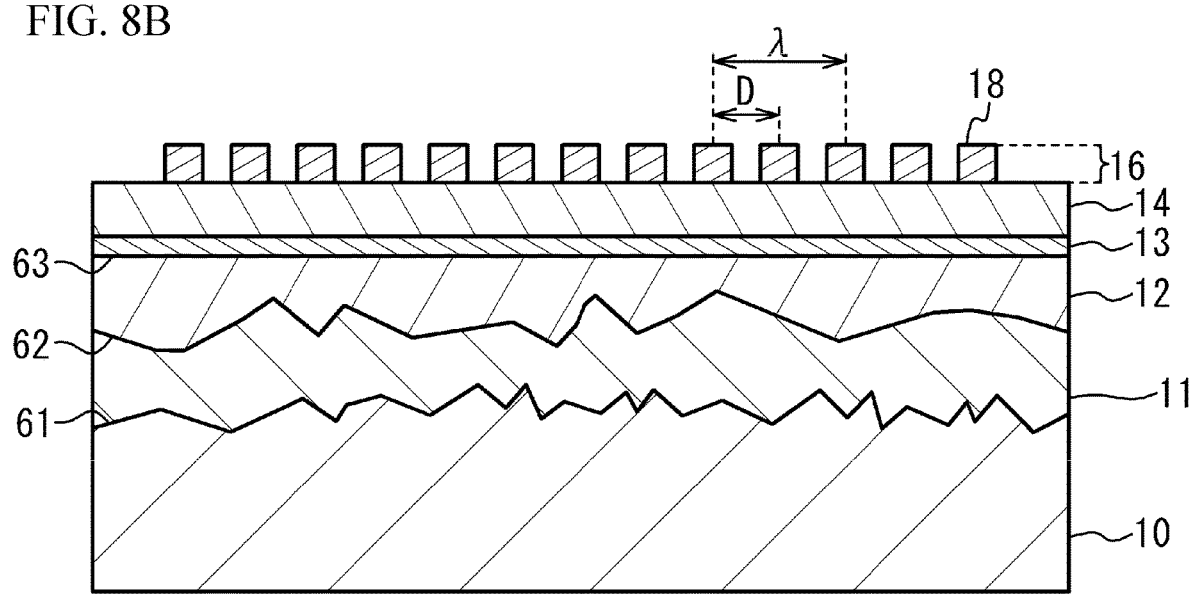

FIG. 8B is a cross-sectional view of an acoustic wave resonator in accordance with a ninth variation of the first embodiment. As illustrated in FIG. 8B, each of the surfaces 61 and 62 is irregularly protruded and recessed. The surface roughness of the surface 62 is less than the surface roughness of the surface 61. Other structures are the same as those of the first embodiment, and the description thereof is thus omitted. As in the eighth and ninth variations of the first embodiment, each of the surfaces 61 and 62 may be irregularly protruded and recessed. The surface roughness of the surface 61 may be different from the surface roughness of the surface 62. The arithmetic average roughness Ra of each of the surfaces 61 and 62 having irregular unevenness is 0.15 µm, for example.

Tenth Variation of the First Embodiment

Figure 9A:
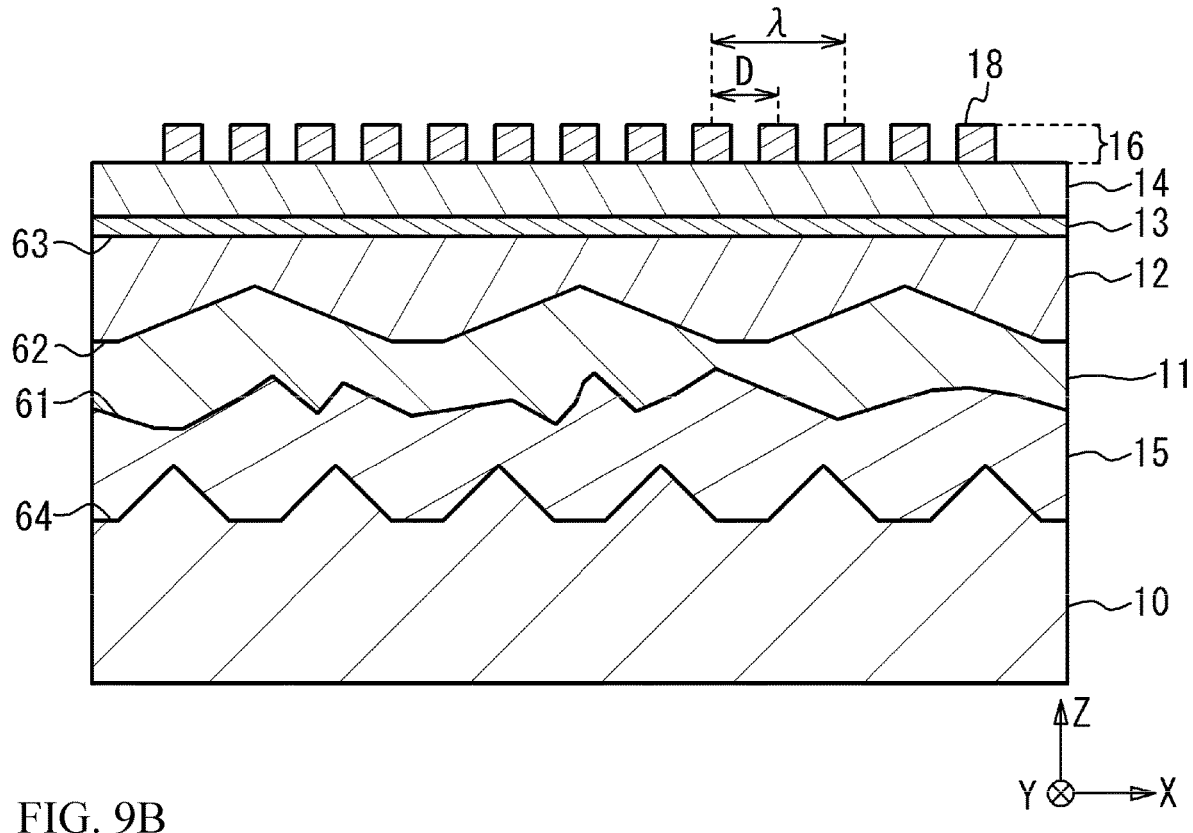
FIG. 9A and FIG. 9B are cross-sectional views of acoustic wave resonators in accordance with tenth and eleventh variations of the first embodiment, respectively.

FIG. 9A is a cross-sectional view of an acoustic wave resonator in accordance with a tenth variation of the first embodiment. As illustrated in FIG. 9A, a boundary layer 15 is interposed between the boundary layer 11 and the support substrate 10. A surface 64, which is closer to the support substrate 10, of the boundary layer 15 is a regularly protruding and recessed surface. Other structures are the same as those of the first embodiment and the first to ninth variations thereof, and the description thereof is thus omitted.

Eleventh Variation of the First Embodiment

Figure 9B:
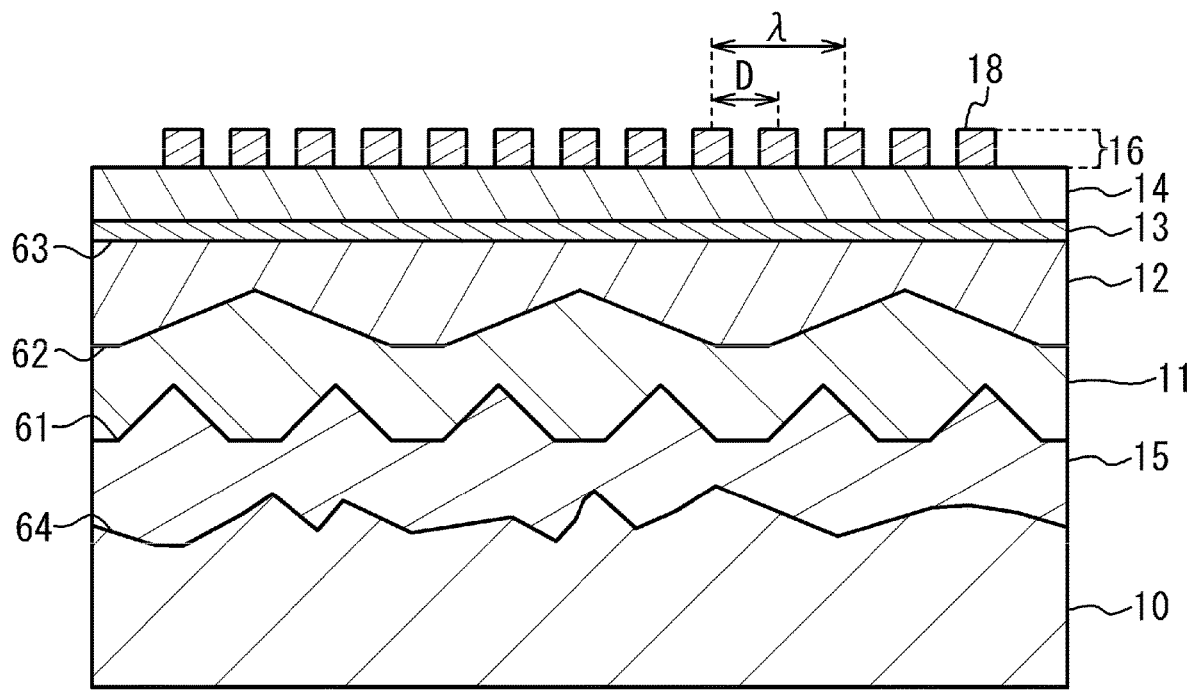

FIG. 9B is a cross-sectional view of an acoustic wave resonator in accordance with an eleventh variation of the first embodiment. As illustrated in FIG. 9B, the boundary layer 15 is interposed between the boundary layer 11 and the support substrate 10. The surface 64, which is closer to the support substrate 10, of the boundary layer 15 is an irregularly protruding and recessed surface. Other structures are the same as those of the first embodiment and the first to ninth variations thereof, and the description thereof is thus omitted. As in the tenth and eleventh variations of the first embodiment, the boundary layers 11 and 15 of which the materials are different from each other (for example, the boundary layers 11 and 15 having different acoustic velocities of the bulk wave) may be interposed between the temperature compensation film 12 and the support substrate 10. A boundary face between the boundary layers 11 and 15 may be uneven.

Twelfth Variation of the First Embodiment

Figure 10A:
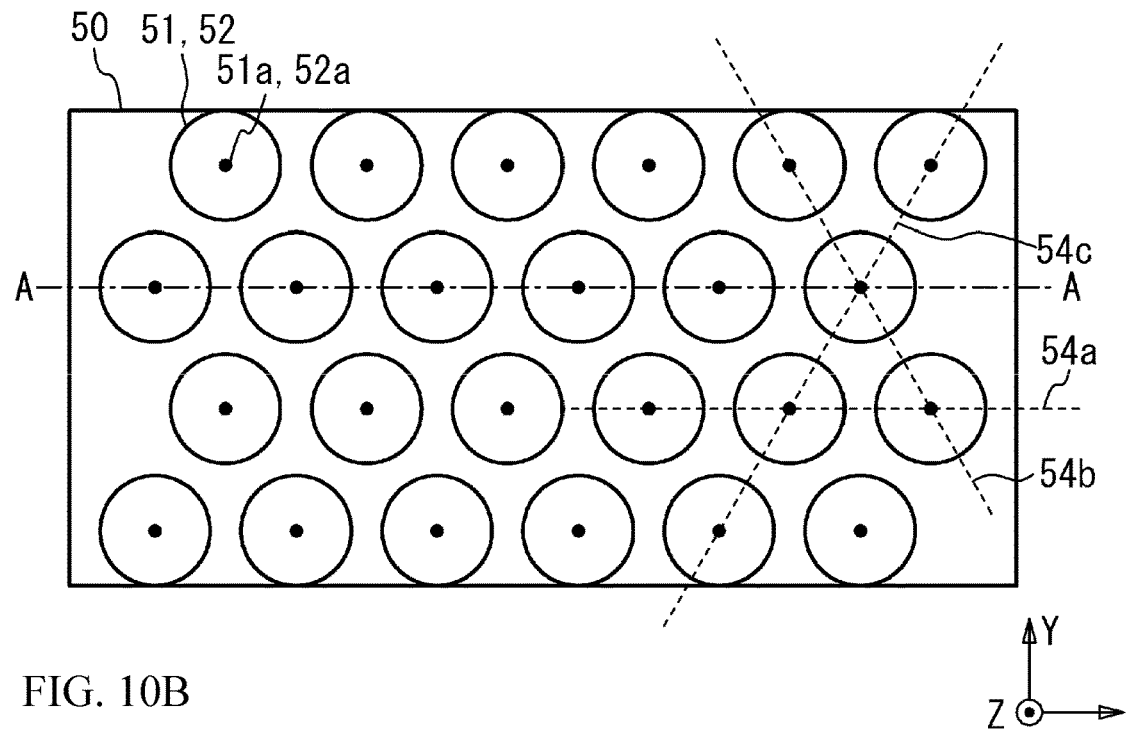
FIG. 10A is a plan view illustrating arrangements of protruding portions and recessed portions in a twelfth variation of the first embodiment.
Figure 10B:
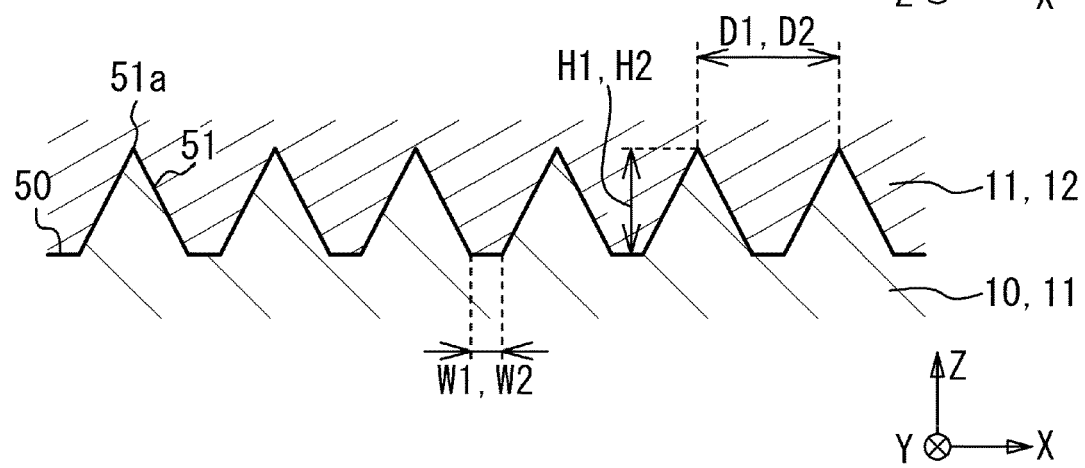
FIG. 10B and FIG. 10C are cross-sectional views taken along line A-A in FIG. 10A.
Figure 10C:
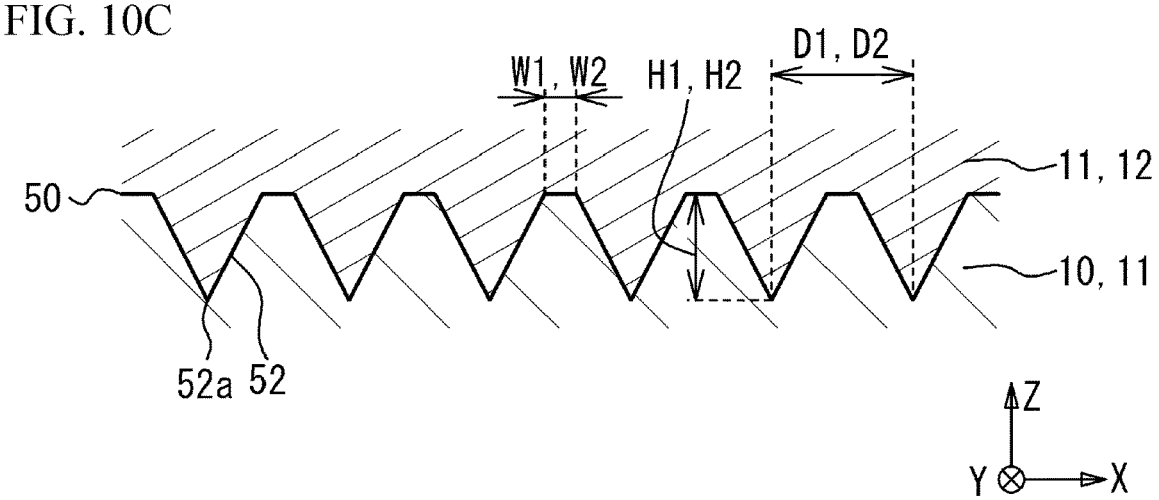

Twelfth and thirteenth variations of the first embodiment are examples of the protruding portions 51 and the recessed portions 52 of the surfaces 61 and 62. FIG. 10A is a plan view illustrating arrangements of protruding portions and recessed portions in the twelfth variation of the first embodiment, and FIG. 10B and FIG. 10C are cross-sectional views taken along line A-A in FIG. 10A. FIG. 10B illustrates an example of the protruding portions 51, and FIG. 10C illustrates an example of the recessed portions 52.

As illustrated in FIG. 10A to FIG. 10C, the protruding portions 51 and the recessed portions 52 are arranged at regular intervals. The three-dimensional shapes of the protruding portion 51 and the recessed portion 52 are the shape of a circular cone. Each of points 51*a* and 52*a* is the apex of the circular cone. As illustrated in FIG. 10B, the flat surface 50 has the protruding portions 51. As illustrated in FIG. 10C, the flat surface 50 has the recessed portions 52. The regular intervals D1 and D2 between the protruding portions 51 or the regular intervals D1 and D2 between the recessed portions 52 are the smallest in three directions 54*a* to 54*c*. The angle between the directions 54*a* and 54*b*, the angle between the directions 54*b* and 54*c*, and the angle between the directions 54*c* and 54*a* are approximately 60°. The direction 54*a* is substantially parallel to the X direction. The regular intervals D1 and D2 between the protruding portions 51 and the regular intervals D1 and D2 between the recessed portions 52 are substantially uniform, the distances W1 and W2 between the protruding portions 51 and the distances W1 and W2 between the recessed portions 52 in the directions 54*a* to 54*c* are substantially uniform, and the heights H1 and H2 of the protruding portions 51 and the recessed portions 52 are substantially uniform. The three-dimensional shapes of the protruding portions 51 and the recessed portions 52 may be, for example, the shape of a cone such as a circular cone and a polygonal pyramid, the shape of a truncated cone such as a circular truncated cone and a truncated polygonal pyramid, the shape of a columnar such as a circular cylinder and a polygonal prism, a hemispherical shape, or a toroidal shape, or may be other three-dimensional shapes. No flat surface 50 may be formed between the protruding portions 51 and between the recessed portions 52.

Thirteenth Variation of the First Embodiment

Figure 11A:
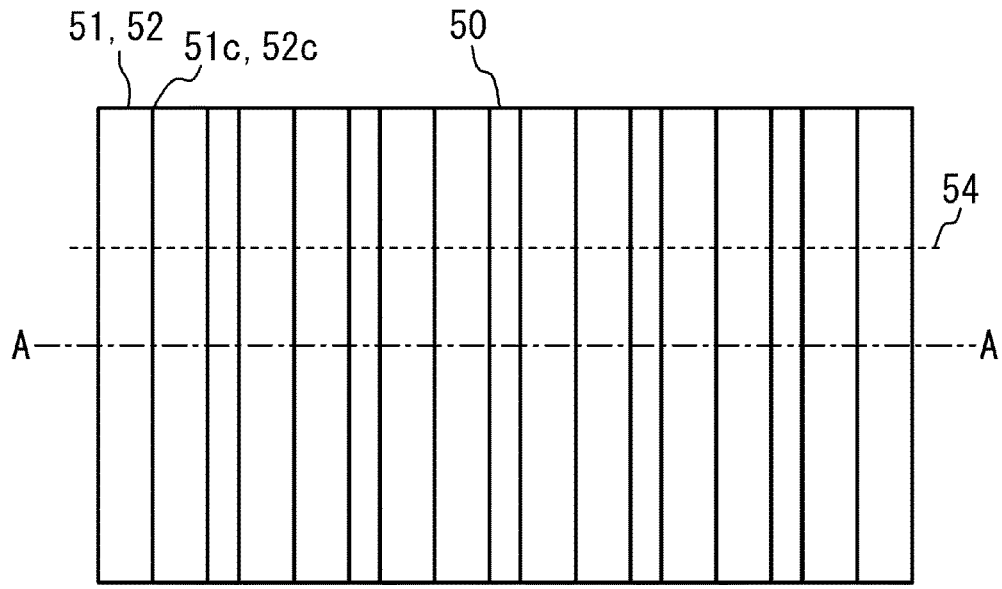
FIG. 11A is a plan view illustrating arrangements of protruding portions and recessed portions in a thirteenth variation of the first embodiment.
Figure 11B:
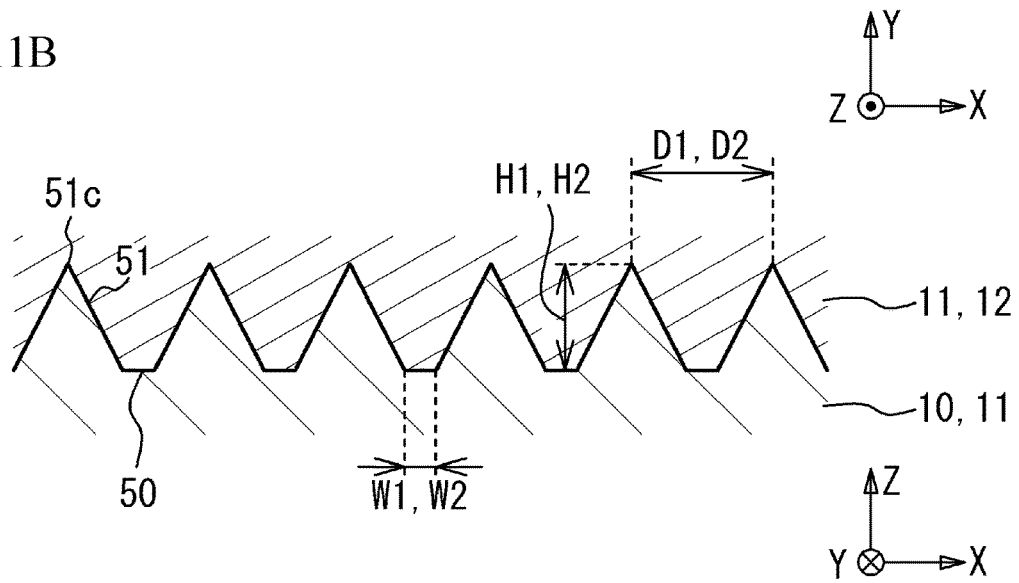
FIG. 11B and FIG. 11C are cross-sectional views taken along line A-A in FIG. 11A.
Figure 11C:
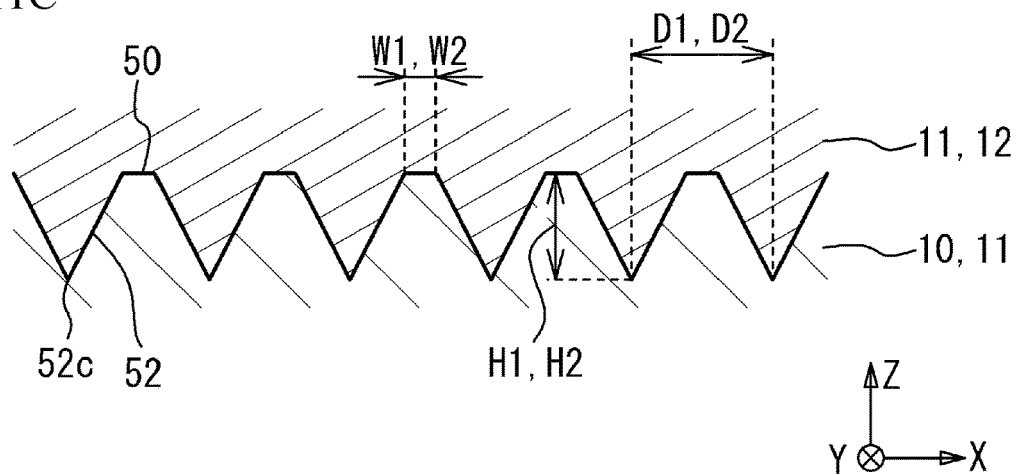

FIG. 11A is a plan view illustrating arrangements of the protruding portions and the recessed portions in a thirteenth variation of the first embodiment, and FIG. 11B and FIG. 11C are cross-sectional views taken along line A-A in FIG. 10A. FIG. 11B is an example of the protruding portions 51, and FIG. 11C is an example of the recessed portions 52.

As illustrated in FIG. 11A to FIG. 11C, the protruding portions 51 and the recessed portions 52 are arranged at regular intervals. The protruding portions 51 and the recessed portions 52 are line-shaped or stripe-shaped. The protruding portions 51 and the recessed portions 52 have a line shape having a triangular cross section. A line 51c is a line connecting the vertices of the triangles in the protruding portion 51, and a line 52c is a line connecting the vertices of the triangles in the recessed portion 52. A direction 54 in which the regular intervals D1 and D2 between the protruding portions 51 are the smallest or the direction 54 in which the regular intervals D1 and D2 between the recessed portions 52 are the smallest are substantially parallel to the X direction. The regular intervals D1 and D2 are substantially uniform, the widths W1 and W2 between the protruding portions 51 in the direction 54 and the widths W1 and W2 between the recessed portions 52 in the direction 54 are substantially uniform, and the heights H1 and H2 of the protruding portions 51 and the heights H1 and H2 of the recessed portions 52 are substantially uniform. The cross-sectional shapes of the protruding portions 51 and the recessed portions 52 may be, for example, a semicircular shape or an elliptical shape, may be a square shape, or may be other cross-sectional shapes. The lines 51c and 52c may be a straight line or a curved line. No flat surface 50 may be formed between the protruding portions 51 and between the recessed portions 52.

Fourteenth Variation of the First Embodiment

Figure 12A:
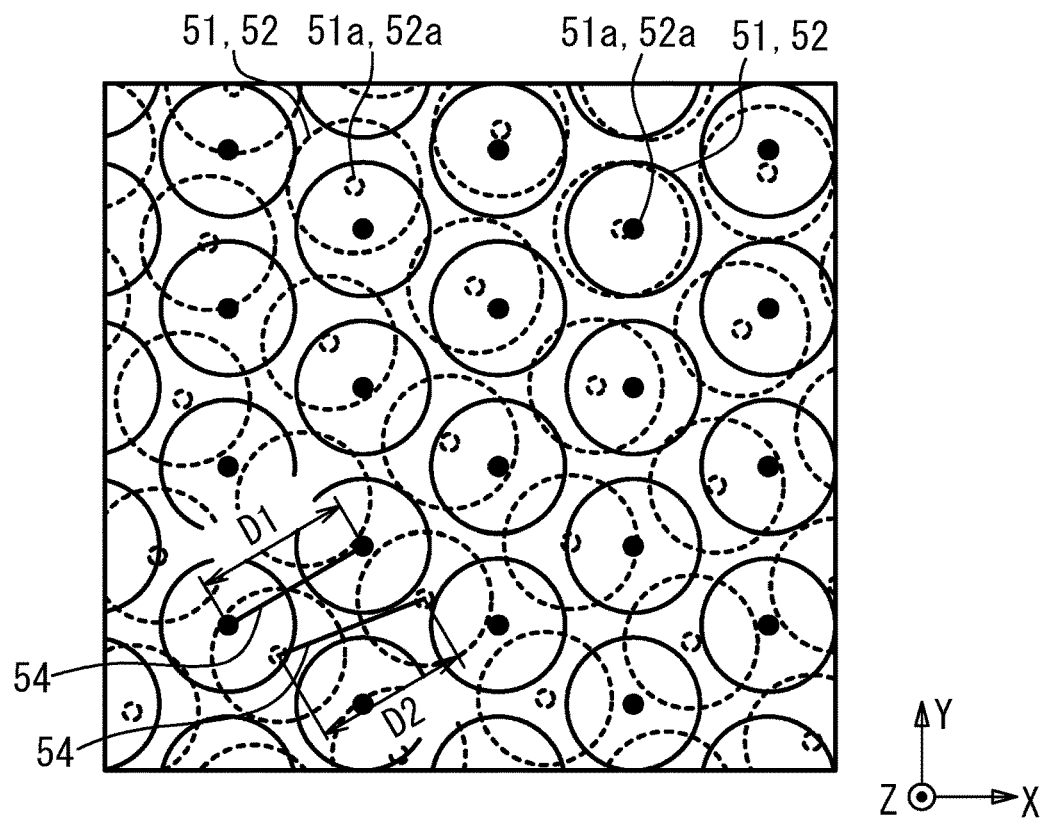
FIG. 12A is a plan view of surfaces 61 and 62 in a fourteenth variation of the first embodiment.

FIG. 12A is a plan view of the surfaces 61 and 62 in a fourteenth variation of the first embodiment. The protruding portions 51 and the recessed portions 52 of the surface 61 are illustrated by solid lines, and the protruding portions 51 and the recessed portions 52 of the surface 62 are illustrated by broken lines. As illustrated in FIG. 12A, the protruding portions 51 of the surface 61 or the recessed portions 52 of the surface 61 are arranged in the same manner as those in the twelfth variation of the first embodiment, and the protruding portions 51 of the surface 62 or the recessed portions 52 of the surface 62 are arranged in the same manner as those in the twelfth variation of the first embodiment. However, the direction 54 in which the regular interval D1 between the protruding portions 51 is the smallest or the direction 54 in which the regular interval D1 between the recessed portions 52 is the smallest on the surface 61 is different from the direction 54 in which the regular interval D2 between the protruding portions 51 is the smallest or the direction 54 in which the regular interval D2 between the recessed portions 52 is the smallest on the surface 62.

Fifteenth Variation of the First Embodiment

Figure 12B:
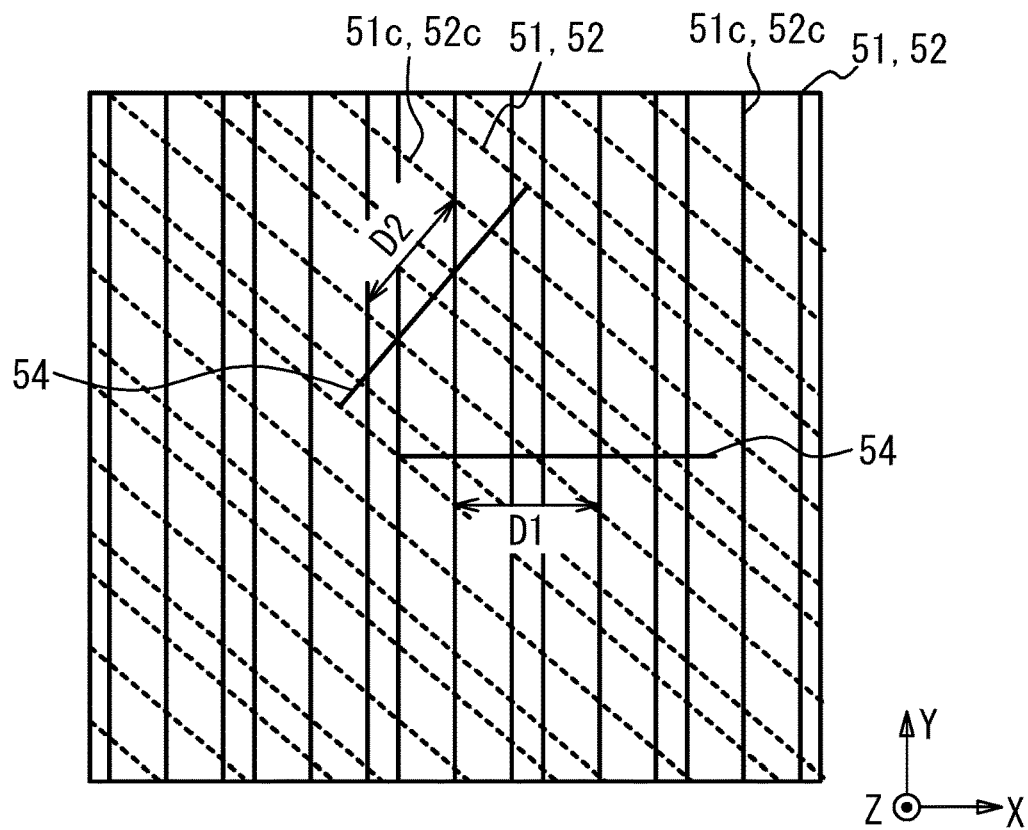
FIG. 12B is a plan view of the surfaces 61 and 62 of a fifteenth variation of the first embodiment.

FIG. 12B is a plan view of the surfaces 61 and 62 of a fifteenth variation of the first embodiment. The protruding portions 51 and the recessed portions 52 of the surface 61 are illustrated by solid lines, and the protruding portions 51 and the recessed portions 52 of the surface 62 are illustrated by broken lines. As illustrated in FIG. 12B, the protruding portions 51 of the surface 61 or the recessed portions 52 of the surface 61 are arranged in the same manner as those in the thirteenth variation of the first embodiment, and the protruding portions 51 of the surface 62 or the recessed portions 52 of the surface 62 are arranged in the same manner as those in the thirteenth variation of the first embodiment. However, the direction 54 in which the regular interval D1 between the protruding portions 51 is the smallest or the direction 54 in which the regular interval D1 between the recessed portions 52 is the smallest on the surface 61 is different from the direction 54 in which the regular interval D2 between the protruding portions 51 is the smallest or the direction 54 in which the regular interval D2 between the recessed portions 52 is the smallest on the surface 62. As in the fourteenth and fifteenth variations of the first embodiment, the direction in which the protruding portions 51 or the recessed portions 52 are regularly arranged may be different between the surface 61 and the surface 62.

Sixteenth Variation of the First Embodiment

Figure 13A:
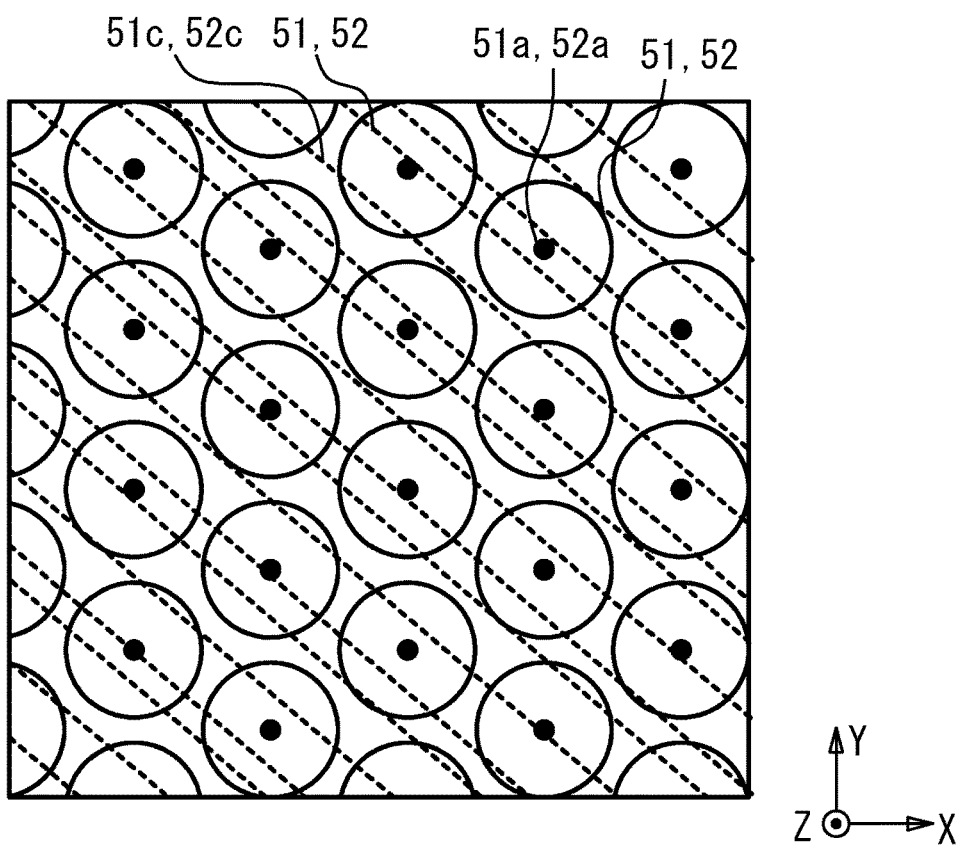
FIG. 13A is a plan view of the surfaces 61 and 62 in a sixteenth variation of the first embodiment.

FIG. 13A is a plan view of the surfaces 61 and 62 in a sixteenth variation of the first embodiment. The protruding portions 51 and the recessed portions 52 of the surface 61 are illustrated by solid lines, and the protruding portions 51 and the recessed portions 52 of the surface 62 are illustrated by broken lines. As illustrated in FIG. 13A, the protruding portions 51 or the recessed portions 52 of the surface 61 are arranged in the same manner as those in the twelfth variation of the first embodiment. The protruding portions 51 or the recessed portions 52 of the surface 62 are inclined with respect to those in the thirteenth variation of the first embodiment.

Seventeenth Variation of the First Embodiment

Figure 13B:
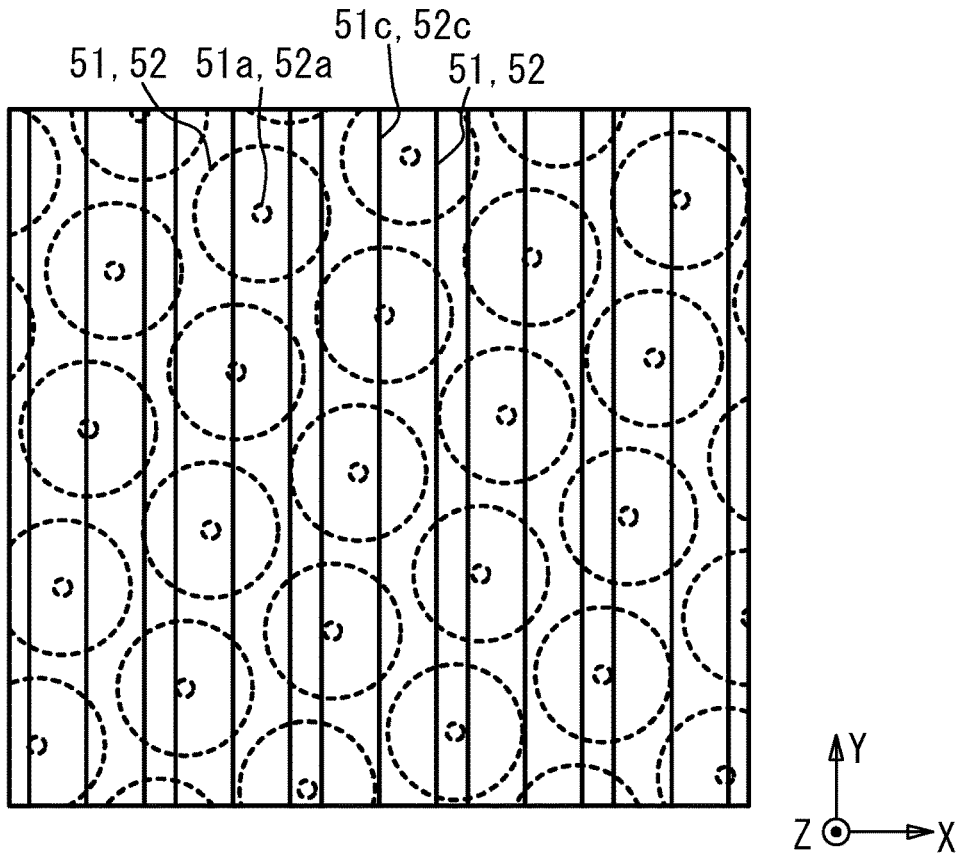
FIG. 13B is a plan view of the surfaces 61 and 62 of a seventeenth variation of the first embodiment.

FIG. 13B is a plan view of the surfaces 61 and 62 of a seventeenth variation of the first embodiment. The protruding portions 51 and the recessed portions 52 of the surface 61 are illustrated by solid lines, and the protruding portions 51 and the recessed portions 52 of the surface 62 are illustrated by broken lines. As illustrated in FIG. 13B, the protruding portions 51 or the recessed portions 52 of the surface 61 are arranged in the same manner as those in the thirteenth variation of the first embodiment. The protruding portions 51 or the recessed portions 52 of the surface 62 are arranged in the same manner as those in the twelfth variation of the first embodiment. As in the sixteenth and seventeenth variations of the first embodiment, the three-dimensional shape of the protruding portions 51 or the recessed portions 52 of the surface 61 may be different from the three-dimensional shape of the protruding portions 51 or the recessed portions 52 of the surface 62.

In the first embodiment, the surface 61 (a first surface), which is closer to the support substrate 10, of the boundary layer 11 has a plurality of protruding portions 51 and/or a plurality of recessed portions 52 (a plurality of first protruding portions and/or a plurality of first recessed portions), and the surface 62 (a second surface), which is closer to the temperature compensation film 12, of the boundary layer 11 has a plurality of protruding portions 51 and/or a plurality of recessed portions 52 (a plurality of second protrusions and/or a plurality of second recesses). Thus, the bulk wave, which is the unnecessary wave, that has passed through the temperature compensation film 12 from the piezoelectric layer 14 is scattered by the surfaces 61 and 62. Accordingly, the spurious emissions due to the bulk wave can be reduced as presented in FIG. 3B.

The heights H1 and H2 of the protruding portions 51 of the surfaces 61 and 62 and/or the recessed portions 52 of the surfaces 61 and 62 are preferably $0.1\lambda$ or greater, more preferably $0.3\lambda$ or greater, further preferably $0.5\lambda$ or greater. The upper limit of the heights H1 and H2 is $2\lambda$, for example. To prevent the unnecessary wave from being scattered by the surface 63, the arithmetic average roughness Ra of the surface 62 is preferably, for example, 10 nm or less, more preferably 1 nm or less.

The acoustic velocity of the bulk wave propagating through the boundary layer 11 is different from the acoustic velocity of the bulk wave propagating through the temperature compensation film 12. The acoustic velocity of the bulk wave propagating through the support substrate 10 is different from the acoustic velocity of the bulk wave propagating through the boundary layer 11. Thus, the unnecessary waves can be scattered by the surfaces 61 and 62. The acoustic velocity of the bulk wave propagating through the boundary layer 11 is preferably equal to or greater than 1.2 times the acoustic velocity of the bulk wave propagating through the temperature compensation film 12, or the acoustic velocity of the bulk wave propagating through the temperature compensation film 12 is preferably equal to or greater than 1.2 times the acoustic velocity of the bulk wave propagating through the boundary layer 11. The acoustic velocity of the bulk wave propagating through the support substrate 10 is preferably equal to or greater than 1.2 times the acoustic velocity of the bulk wave propagating through the boundary layer 11, or the acoustic velocity of the bulk wave propagating through the boundary layer 11 is preferably equal to or greater than 1.2 times the acoustic velocity of the bulk wave propagating through the support substrate 10.

The acoustic velocity of the bulk wave propagating through the boundary layer 11 is preferably greater than the acoustic velocity of the bulk wave propagating through the temperature compensation film 12. This configuration causes the acoustic wave to be confined within the piezoelectric layer 14 and the temperature compensation film 12. The acoustic velocity of the bulk wave propagating through the boundary layer 11 is preferably equal to or greater than 1.1 times the acoustic velocity of the bulk wave propagating through the temperature compensation film 12, more preferably equal to or greater than 1.2 times the acoustic velocity of the bulk wave propagating through the temperature compensation film 12. Moreover, the acoustic velocity of the bulk wave propagating through the boundary layer 11 and the acoustic velocity of the bulk wave propagating through the bonding layer 13 are preferably greater than the acoustic velocity of the bulk wave propagating through the piezoelectric layer 14. The acoustic velocity of the bulk wave propagating through the boundary layer 11 is preferably equal to or less than 2.0 times the acoustic velocity of the bulk wave propagating through the temperature compensation film 12, more preferably equal to or less than 1.5 times the acoustic velocity of the bulk wave propagating through the temperature compensation film 12.

The acoustic velocity of the bulk wave propagating through the temperature compensation film 12 may be greater than the acoustic velocity of the bulk wave propagating through the piezoelectric layer 14, but the acoustic velocity of the bulk wave propagating through the temperature compensation film 12 is preferably less than the acoustic velocity of the bulk wave propagating through the piezoelectric layer 14. This configuration causes the unnecessary wave to be less likely to pass through the bonding layer 13, further reducing spurious emissions. The acoustic velocity of the bulk wave propagating through the temperature compensation film 12 is preferably equal to or less than 0.99 times the acoustic velocity of the bulk wave propagating through the piezoelectric layer 14. Too low acoustic velocity of the bulk wave propagating through the temperature compensation film 12 causes the acoustic wave to be less likely to exist within the piezoelectric layer 14. Therefore, the acoustic velocity of the bulk wave propagating through the temperature compensation film 12 is preferably equal to or greater than 0.9 times the acoustic velocity of the bulk wave propagating through the piezoelectric layer 14.

When most of the energy of the surface acoustic wave exists in the section from the upper surface of the piezoelectric layer 14 to a depth of $2\lambda$, to confine the energy of the acoustic wave, which is the primary mode, within the piezoelectric layer 14 and the temperature compensation film 12 and reduce the spurious response, a distance between the surface closer to the support substrate 10 of the temperature compensation film 12 and the surface closer to the comb-shaped electrode 20 of the piezoelectric layer 14 (T2+T3+T4) is preferably equal to or less than 4 times ($2\lambda$) the average pitch D of a plurality of the electrode fingers 18, more preferably equal to or less than 3 times ($1.5\lambda$) the average pitch D of the plurality of the electrode fingers 18. The average pitch D of the plurality of the electrode fingers 18 is calculated by dividing the width of the IDT 20 in the X direction by the number of the electrode fingers 18.

In order to allow the energy of the acoustic wave to exist within the temperature compensation film 12, the thickness T4 of the piezoelectric layer 14 is preferably equal to or less than 2 times ($\lambda$) the average pitch D of the electrode fingers 18, more preferably equal to or less than 1.2 times ($0.6\lambda$) the average pitch D of the electrode fingers 18. When the piezoelectric layer 14 is too thin, the acoustic wave is not excited. Therefore, the thickness T4 of the piezoelectric layer 14 is preferably equal to or less than 0.2 times ($0.1\lambda$) the average pitch D of the electrode fingers 18.

As presented in FIG. 4B, when the thickness T1 of the boundary layer 11 is thin, the spurious emissions increase. From this point of view, the thickness T1 of the boundary layer 11 is preferably equal to or greater than 0.6 times ($0.3\lambda$) the average pitch D of the electrode fingers 18, more preferably equal to or greater than 1.4 times ($0.7\lambda$) the average pitch D of the electrode fingers 18, further preferably equal to or greater than 2 times ($\lambda$) the average pitch D of the electrode fingers 18, yet further preferably equal to or greater than 4 times ($2\lambda$) the average pitch D of the electrode fingers 18.

When the unevenness is irregular, the roughness of the rough surface differs depending on the location in the XY plane. Thus, in the microscopic sense, the characteristic such as the magnitude of the spurious emission differs depending on the location. For example, even when the roughness of the rough surface is made to be the roughness that minimizes the spurious emission, since the magnitude of the spurious emission differs depending on the location, the magnitude of the spurious emission becomes greater than the optimal spurious emission in the macroscopic sense.

As in the first embodiment and the first to fifth and twelfth to seventeenth variations thereof, the surface 61 has the protruding portions 51 and/or the recessed portions 52 that are regularly arranged, and the surface 62 has the protruding portions 51 and/or the recessed portions 52 that are regularly arranged. Thus, spurious emissions can be reduced as presented in FIG. 3B. This structure also makes the characteristic such as the magnitude of the spurious emission uniform.

When the wavelength of the unnecessary wave to be suppressed among one or more unnecessary waves is one, as in the first embodiment, the regular interval D1 between the protruding portions 51 and/or the recessed portions 52 of the surface 61 is configured to be approximately equal to the regular interval D2 between the protruding portions 51 and/or the recessed portions 52 of the surface 62 to the extent of manufacturing errors. This configuration further reduces the spurious response due to the unnecessary wave. For example, |D1−D2|/(D1+D2) is preferably equal to or less than 0.05 (|D1−D2|/(D1+D2) 0.05), more preferably equal to or less than 0.005 (|D1−D2|/(D1+D2)≤0.005), further preferably equal to or less than 0.002 (|D1−D2|/(D1+D2)≤0.002). |D1−D2| is the absolute value of (D1−D2).

As presented in FIG. 4B, to reduce the spurious emissions, the regular intervals D1 and D2 between the protruding portions 51 and/or the recessed portions 52 are preferably equal to or greater than 1.6 times (0.8λ) the average pitch D of the electrode fingers 18, more preferably equal to or greater than 2.0 times (λ) the average pitch D of the electrode fingers 18. As presented in FIG. 4A, to increase the response in the primary mode, the regular intervals D1 and D2 between the protruding portions 51 and/or the recessed portions 52 are preferably equal to or less than 4.8 times (2.4λ) the average pitch D of the electrode fingers 18, more preferably equal to or less than 3.2 times (1.6λ) the average pitch D of the electrode fingers 18.

As presented in FIG. 4B, the regular intervals D1 and D2 that have effects on the spurious emission differ depending on the wavelength of the unnecessary wave. Thus, as in the second and third variations of the first embodiment, the regular interval D1 between the protruding portions 51 and/or the recessed portions 52 of the surface 61 is configured to be different from the regular interval D2 between the protruding portions 51 and/or the recessed portions 52 of the surface 62. This configuration reduces spurious emissions having different wavelengths. In addition, 2×|D1−D2|/(D1+D2) is preferably equal to or greater than 0.5, more preferably equal to or greater than 1.0.

As in the first variation of the first embodiment, the phase of the protruding portions 51 and/or the recessed portions 52 of the surface 61 may be different from the phase of the protruding portions 51 and/or the recessed portions 52 of the surface 62. As in the fourth and fifth variations of the first embodiment, the heights H1 of the protruding portions 51 and/or the recessed portions 52 of the surface 61 may be different from the heights H2 of the protruding portions 51 and/or the recessed portions 52 of the surface 62. As in the fourteenth and fifteenth variations of the first embodiment, the direction in which the regular interval between the protruding portions 51 and/or the recessed portions 52 is the smallest on the surface 61 may be different from the direction in which the regular interval between the protruding portions 51 and/or the recessed portions 52 is the smallest on the surface 62. As in the sixteenth and seventeenth variations of the first embodiment, the three-dimensional shapes of the protruding portions 51 and/or the recessed portions 52 of the surface 61 may be different from the three-dimensional shapes of the protruding portions 51 and/or the recessed portions 52 of the surface 62. These configurations allow the surfaces 61 and 62 to scatter different unnecessary waves.

As in the sixth to ninth variations of the first embodiment, the protruding portions 51 and/or the recessed portions 52 of at least one of the surfaces 61 or 62 may be irregularly arranged. The arithmetic average roughness Ra of the surface 61 and/or the surface 62 having the protruding portions 51 and the recessed portions 52 that are irregularly arranged is preferably equal to or greater than, for example, 10 nm, more preferably equal to or greater than 100 nm. This configuration causes the unnecessary waves to be scattered.

To retain the functions of the piezoelectric layer 14 and the temperature compensation film 12, the thickness T3 of the bonding layer 13 is preferably equal to or less than 20 nm, more preferably equal to or less than 10 nm. To retain the function as the bonding layer 13, the thickness T3 is preferably equal to or greater than 1 nm, more preferably equal to or greater than 2 nm. The bonding layer 13 may be omitted.

The piezoelectric layer 14 is a monocrystal mainly composed of lithium tantalate or lithium niobate, the temperature compensation film 12 is a polycrystal mainly composed of silicon oxide or an amorphia mainly composed of silicon oxide, the boundary layer 11 and the bonding layer 13 are a polycrystal mainly composed of aluminum oxide or an amorphia mainly composed of aluminum oxide, and the support substrate 10 is a sapphire substrate or a silicon carbide substrate. Thus, the spurious response can be reduced as described in the simulation. The term "mainly composed of a certain material" means that impurities are contained intentionally or unintentionally, and for example, 50 atomic % or greater of the certain material, 80 atomic % or greater of the certain material, or 90 atomic % or greater of the certain material is contained. For example, 80 atomic % or greater of silicon oxide is contained in the temperature compensation film 12. That is, the total of the concentration of oxygen and the concentration of silicon in the temperature compensation film 12 is 80 atomic % or greater. In addition, each of the concentration of oxygen and the concentration of silicon in the temperature compensation film 12 is 10 atomic % or greater, for example.

In the first embodiment and the variations thereof, when the acoustic wave mainly excited by a pair of the comb-shaped electrodes 20 is a shear horizontal (SH) wave, a bulk wave is likely to be excited as the unnecessary wave. When the piezoelectric layer 14 is a 36° or greater and 48° or less rotated Y-cut lithium tantalate layer, the SH wave is excited. Therefore, it is preferable to provide the boundary layer 11 in this case. The acoustic wave mainly excited by a pair of the comb-shaped electrodes 20 is not limited to the SH wave, and may be, for example, a Lamb wave.

Second Embodiment

Figure 14A:
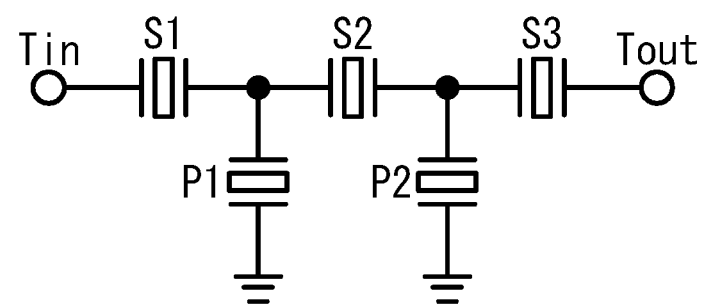
FIG. 14A is a circuit diagram of a filter in accordance with a second embodiment.

FIG. 14A is a circuit diagram of a filter in accordance with a second embodiment. As illustrated in FIG. 14A, one or more series resonators S1 to S3 are connected in series between an input terminal Tin and an output terminal Tout. One or more parallel resonators P1 and P2 are connected in parallel between the input terminal Tin and the output terminal Tout. The acoustic wave resonator of the first embodiment may be used for at least one resonator of the one or more series resonators S1 to S3, at least one of the one or more parallel resonators P1 and P2, or any combination of the one or more series resonators S1 to S3 and the one or more parallel resonators P1 and P2. The number of resonators included in the ladder-type filter can be freely selected. The filter may be a multimode type filter.

First Variation of the Second Embodiment

Figure 14B:
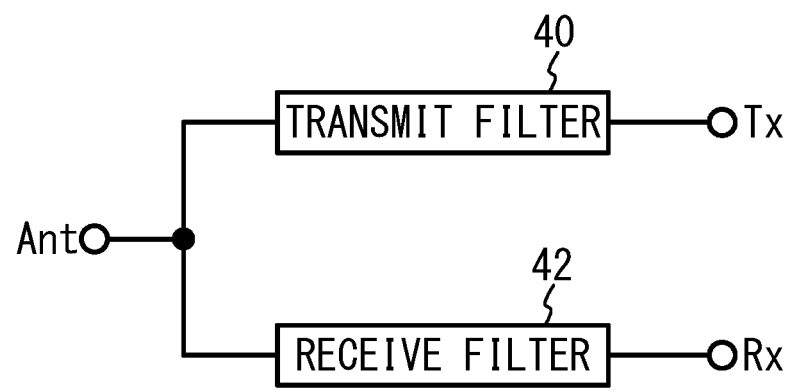
FIG. 14B is a circuit diagram of a duplexer in accordance with a first variation of the second embodiment.

FIG. 14B is a circuit diagram of a duplexer in accordance with a first variation of the second embodiment. As illustrated in FIG. 14B, a transmit filter 40 is connected between a common terminal Ant and a transmit terminal Tx. A receive filter 42 is connected between the common terminal Ant and a receive terminal Rx. The transmit filter 40 transmits signals in the transmit band as transmission signals to the common terminal Ant among high-frequency signals input from the transmit terminal Tx, and suppresses signals with other frequencies. The receive filter 42 transmits signals in the receive band as reception signals to the receive terminal Rx among high-frequency signals input from the common terminal Ant, and suppresses signals with other frequencies. The transmit filter 40, the receive filter 42, or the transmit filter 40 and the receive filter 42 may be the filter of the second embodiment.

A duplexer has been described as an example of the multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave device comprising:
    a support substrate;
    a piezoelectric layer provided over the support substrate;
    at least one pair of comb-shaped electrodes disposed on the piezoelectric layer, each of the at least one pair of comb-shaped electrodes including electrode fingers;
    a temperature compensation film interposed between the support substrate and the piezoelectric layer, the temperature compensation film having a temperature coefficient of elastic constant opposite in sign to a temperature coefficient of elastic constant of the piezoelectric layer; and
    an insulating layer interposed between the support substrate and the temperature compensation film, a first surface of the insulating layer having a plurality of first protruding portions and/or a plurality of first recessed portions, a second surface of the insulating layer having a plurality of second protruding portions and/or a plurality of second recessed portions, the first surface being closer to the support substrate, the second surface being closer to the temperature compensation film,
    wherein $|D1-D2|/(D1+D2)$ is equal to or less than 0.05 where D1 represents a regular interval between the plurality of first protruding portions and/or the plurality of first recessed portions and D2 represents a regular interval between the plurality of second protruding portions and/or the plurality of second recessed portions.

2. The acoustic wave device according to claim 1, wherein an acoustic velocity of a bulk wave propagating through the insulating layer is different from an acoustic velocity of a bulk wave propagating through the temperature compensation film, and an acoustic velocity of a bulk wave propagating through the support substrate is different from the acoustic velocity of the bulk wave propagating through the insulating layer.

3. The acoustic wave device according to claim 2, wherein the acoustic velocity of the bulk wave propagating through the insulating layer is greater than the acoustic velocity of the bulk wave propagating through the temperature compensation film.

4. The acoustic wave device according to claim 1, wherein the acoustic velocity of the bulk wave propagating through the temperature compensation film is less than an acoustic velocity of a bulk wave propagating through the piezoelectric layer.

5. The acoustic wave device according to claim 1, wherein a distance between the second surface and a surface closer to the at least one pair of comb-shaped electrodes of the piezoelectric layer is equal to or less than 4 times an average pitch of the plurality of electrode fingers.

6. The acoustic wave device according to claim 1, wherein the plurality of first protruding portions and/or the plurality of first recessed portions are arranged at regular intervals, and the plurality of second protruding portions and/or the plurality of second recessed portions are arranged at regular intervals.

7. The acoustic wave device according to claim 6, wherein the regular intervals at which the plurality of first protruding portions and/or the plurality of first recessed portions are arranged are substantially equal to the regular intervals at which the plurality of second protruding portions and/or the plurality of second recessed portions are arranged.

8. The acoustic wave device according to claim 6, wherein the plurality of first protruding portions and/or the plurality of first recessed portions and the plurality of second protruding portions and/or the plurality of second recessed portions satisfy at least one of following conditions:
    a phase of the plurality of first protruding portions and/or the plurality of first recessed portions is different from a phase of the plurality of second protruding portions and/or the plurality of second recessed portions;
    heights of the plurality of first protrusions and/or the plurality of first recessed portions are different from heights of the plurality of second protruding portions and/or the plurality of second recessed portions;
    a direction in which a regular interval between the plurality of first protruding portions and/or the plurality of first recessed portions is smallest is different from a direction in which a regular interval between the plurality of second protruding portions and/or the plurality of second recessed portions is smallest; and
    the plurality of first protruding portions and/or the plurality of first recessed portions have three-dimensional shapes different from three-dimensional shapes of the plurality of second protruding portions and/or the plurality of second recessed portions.

9. The acoustic wave device according to claim 6, wherein the regular intervals at which the plurality of first protruding portions and/or the plurality of first recessed portions are arranged are different from the regular intervals at which the plurality of second protruding portions and/or the plurality of second recessed portions are arranged.

10. The acoustic wave device according to claim 1, wherein the plurality of first protruding portions and/or the plurality of first recessed portions are irregularly arranged, the plurality of second protruding portions and/or the plurality of second recessed portions are irregularly arranged, or the plurality of first protruding portions and/or the plurality of first recessed portions and the plurality of second protruding portions and/or the plurality of second recessed portions are irregularly arranged.

11. The acoustic wave device according to claim 1, wherein the temperature compensation film contains 80 atomic % or greater of silicon oxide.

12. The acoustic wave device according to claim 1, wherein $|D1-D2|/(D1+D2)$ is equal to or less than 0.005.

13. A filter comprising:
    the acoustic wave device according to claim 1.

14. A multiplexer comprising:
    the filter according to claim 13.

15. An acoustic wave device comprising:
    a support substrate;
    a piezoelectric layer provided over the support substrate;
    at least one pair of comb-shaped electrodes disposed on the piezoelectric layer, each of the at least one pair of comb-shaped electrodes including electrode fingers;

a temperature compensation film interposed between the support substrate and the piezoelectric layer, the temperature compensation film having a temperature coefficient of elastic constant opposite in sign to a temperature coefficient of elastic constant of the piezoelectric layer; and an insulating layer interposed between the support substrate and the temperature compensation film, a first surface of the insulating layer having a plurality of first protruding portions and/or a plurality of first recessed portions, a second surface of the insulating layer having a plurality of second protruding portions and/or a plurality of second recessed portions, the first surface being closer to the support substrate, the second surface being closer to the temperature compensation film, wherein the plurality of first protruding portions and/or the plurality of first recessed portions are arranged at regular intervals, and the plurality of second protruding portions and/or the plurality of second recessed portions are arranged at regular intervals, wherein the regular intervals at which the plurality of first protruding portions and/or the plurality of first recessed portions are arranged are substantially equal to the regular intervals at which the plurality of second protruding portions and/or the plurality of second recessed portions are arranged, and wherein the regular intervals at which the plurality of first protruding portions and/or the plurality of first recessed portions are arranged and the regular intervals at which the plurality of second protruding portions and/or the plurality of second recessed portions are arranged are equal to or greater than 1.6 times an average pitch of the electrode fingers.

16. An acoustic wave device comprising:

a support substrate;

a piezoelectric layer provided over the support substrate;

at least one pair of comb-shaped electrodes disposed on the piezoelectric layer, each of the at least one pair of comb-shaped electrodes including electrode fingers;

a temperature compensation film interposed between the support substrate and the piezoelectric layer, the temperature compensation film having a temperature coefficient of elastic constant opposite in sign to a temperature coefficient of elastic constant of the piezoelectric layer; and an insulating layer interposed between the support substrate and the temperature compensation film, a first surface of the insulating layer having a plurality of first protruding portions and/or a plurality of first recessed portions, a second surface of the insulating layer having a plurality of second protruding portions and/or a plurality of second recessed portions, the first surface being closer to the support substrate, the second surface being closer to the temperature compensation film, wherein an arithmetic average roughness Ra of the second surface is 1 nm or less.

17. The acoustic wave device according to claim 16, wherein an acoustic velocity of a bulk wave propagating through the insulating layer is different from an acoustic velocity of a bulk wave propagating through the temperature compensation film, and an acoustic velocity of a bulk wave propagating through the support substrate is different from the acoustic velocity of the bulk wave propagating through the insulating layer.

18. The acoustic wave device according to claim 17, wherein the acoustic velocity of the bulk wave propagating through the insulating layer is greater than the acoustic velocity of the bulk wave propagating through the temperature compensation film.

19. The acoustic wave device according to claim 16, wherein the acoustic velocity of the bulk wave propagating through the temperature compensation film is less than an acoustic velocity of a bulk wave propagating through the piezoelectric layer.

20. The acoustic wave device according to claim 16, wherein a distance between the second surface and a surface closer to the at least one pair of comb-shaped electrodes of the piezoelectric layer is equal to or less than 4 times an average pitch of the plurality of electrode fingers.

* * * * *